(12) United States Patent
Choi et al.

(10) Patent No.: US 9,972,252 B2
(45) Date of Patent: May 15, 2018

(54) ORGANIC LIGHT-EMITTING DISPLAY PANEL AND ORGANIC LIGHT-EMITTING DISPLAY DEVICE

(71) Applicant: LG DISPLAY CO., LTD., Seoul (KR)

(72) Inventors: Jaeyi Choi, Changwon-si (KR); WooSup Shin, Paju-si (KR); JaeYoung Oh, Goyang-si (KR); HongJae Shin, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 154 days.

(21) Appl. No.: 15/205,642

(22) Filed: Jul. 8, 2016

(65) Prior Publication Data
US 2017/0154579 A1    Jun. 1, 2017

(30) Foreign Application Priority Data
Nov. 27, 2015 (KR) .......................... 10-2015-0167757

(51) Int. Cl.
*G09G 3/3291* (2016.01)
*H01L 27/32* (2006.01)

(52) U.S. Cl.
CPC ....... *G09G 3/3291* (2013.01); *H01L 27/3276* (2013.01); *H01L 27/3288* (2013.01); *G09G 2300/0413* (2013.01); *G09G 2310/027* (2013.01); *G09G 2310/0297* (2013.01); *G09G 2330/08* (2013.01); *G09G 2330/12* (2013.01); *H01L 2251/5392* (2013.01)

(58) Field of Classification Search
CPC ......... G09G 3/3291; G09G 2310/0264; G09G 2310/027; G09G 2310/0272; G09G 2310/0281; G09G 2310/0297; H01L 27/32; H01L 27/3276; H01L 27/3288
See application file for complete search history.

(56) References Cited

U.S. PATENT DOCUMENTS

| 9,098,134 | B2 * | 8/2015 | Lee | G06F 3/041 |
| 9,123,289 | B2 * | 9/2015 | Kim | H01L 27/32 |
| 9,202,411 | B2 * | 12/2015 | Jung | G09G 3/3208 |
| 9,336,717 | B2 * | 5/2016 | Chaji | G09G 3/3233 |

* cited by examiner

*Primary Examiner* — Jennifer Mehmood
*Assistant Examiner* — Sardis F Azongha
(74) *Attorney, Agent, or Firm* — Birch, Stewart, Kolasch & Birch, LLP

(57) ABSTRACT

Discussed is an organic light-emitting display panel including: an active area corresponding to an image display region; and a non-active area corresponding to a region outside of the active area, wherein the active area includes a plurality of signal lines arranged in an array, wherein the non-active area includes a pad region to which a source driver IC is mounted, and a switching structure, wherein the pad region includes a plurality of pads arranged in correspondence with the array of the signal lines, and wherein the switching structure includes: a common reference voltage pad-connection terminal connected to a common reference voltage pad of the display panel; a plurality of reference voltage line-connection terminals connected to a plurality of reference voltage lines of the display panel; and a switching circuit to switch connections between the common reference voltage pad-connection terminal and the plurality of reference voltage line-connection terminals.

20 Claims, 20 Drawing Sheets

FIG.4
VTH SENSING
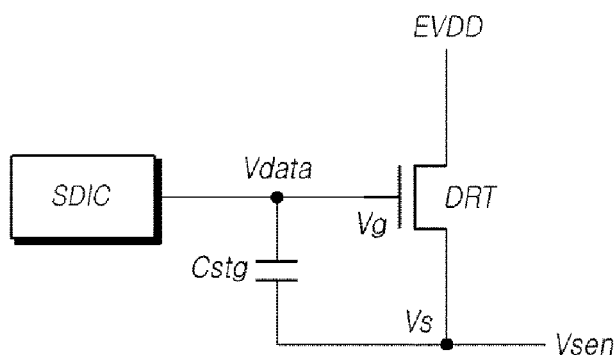
VSEN WAVE
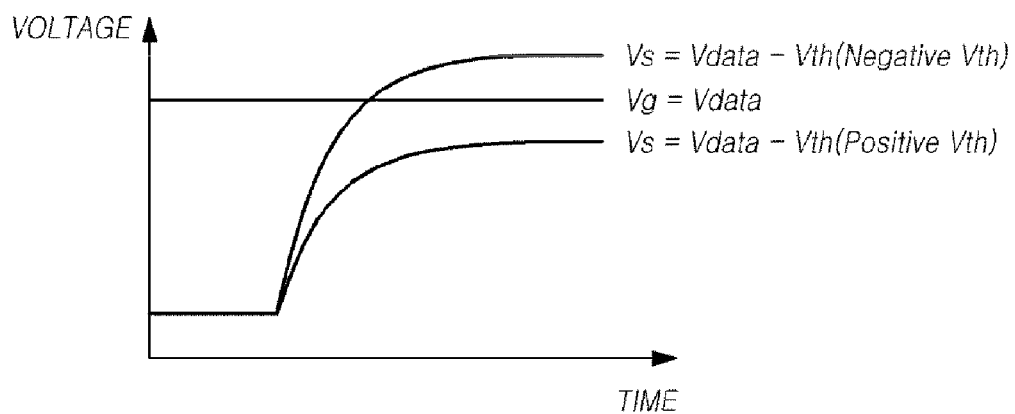

FIG.5
MOBILITY SENSING
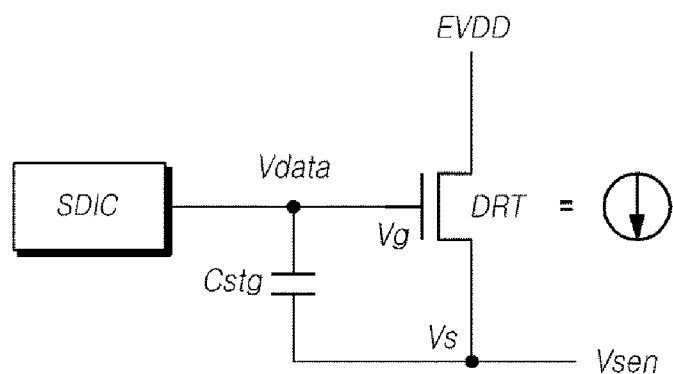
VSEN WAVE
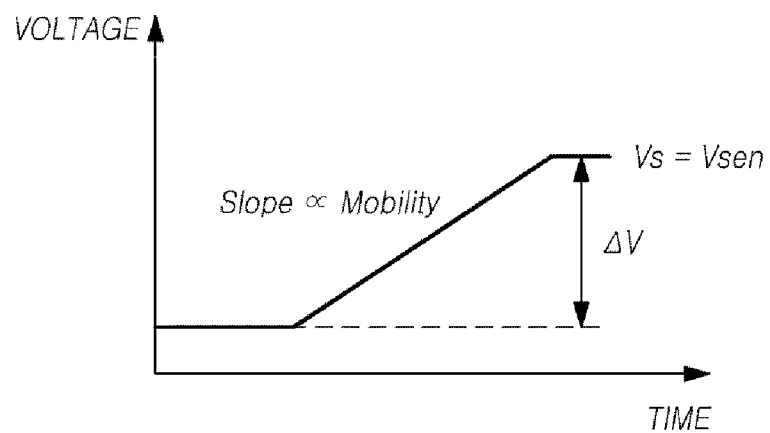

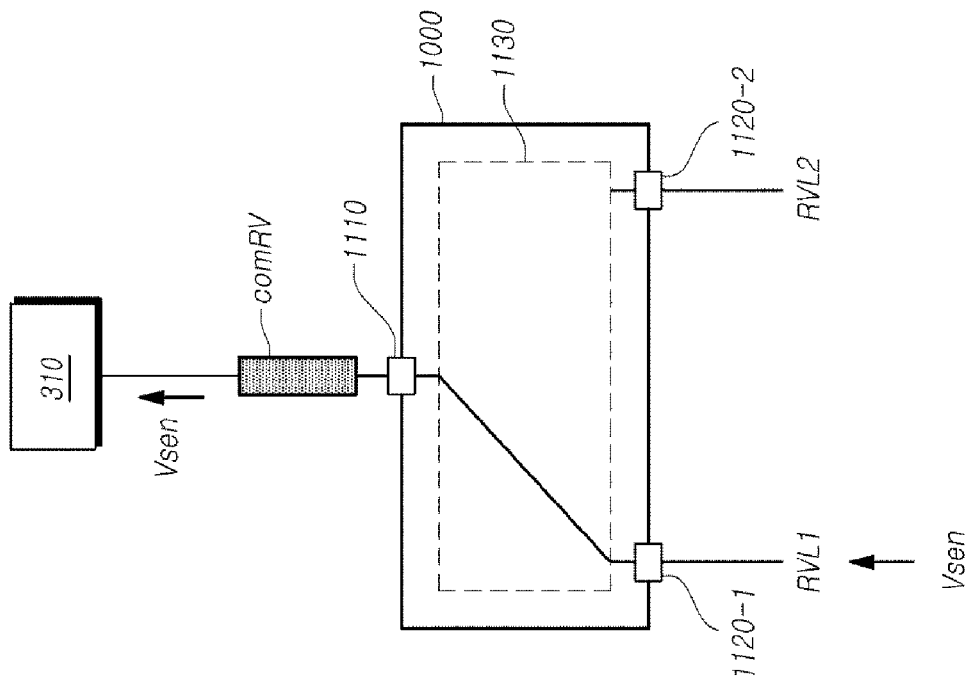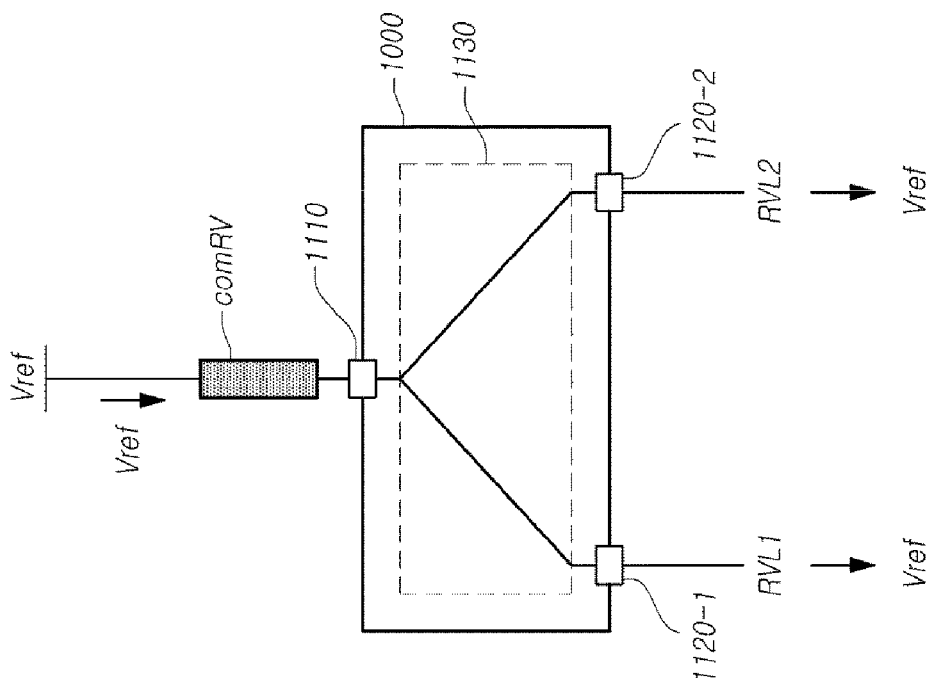
FIG.12

ORGANIC LIGHT-EMITTING DISPLAY PANEL AND ORGANIC LIGHT-EMITTING DISPLAY DEVICE

CROSS REFERENCE TO RELATED APPLICATION

This application claims priority from Korean Patent Application Number 10-2015-0167757 filed on Nov. 27, 2015, which is hereby incorporated by reference for all purposes as if fully set forth herein.

BACKGROUND OF THE INVENTION

Field of the Invention

The present disclosure relates to an organic light-emitting display panel and an organic light-emitting diode display device.

Description of Related Art

Organic light-emitting display devices, which have recently come to prominence as display devices, employ organic light emitting diodes (OLEDs) that emit light by themselves, and have advantages such as a relatively fast response speed, high light emitting efficiency, high levels of brightness, and a wide viewing angle.

Such organic light-emitting display devices are configured to arrange subpixels, in which OLEDs are mounted, in a matrix pattern and control brightness of the subpixels selected by a scanning signal, according to a data grayscale.

In such organic light-emitting display devices, organic light-emitting display panels are supplied with various voltages and signals through a plurality of pads located in a pad region in order to drive the subpixels.

The plurality of pads acting as conduits for supplying the various voltages and signals to the organic light-emitting display panels are designed to be separated from each other and disconnected electrically.

In this context, a pad interval may be designed to be significantly narrow, according to conditions such as panel design, integrated circuit design, and so on. In this instance, a problem may occur, in that when foreign objects are present between the pads, a short circuit may occur between the pads, and elements for forming an image, or the like may not be able to be normally driven.

SUMMARY OF THE INVENTION

According to an embodiment of the present disclosure, provide is an organic light-emitting display panel including: an active area corresponding to an image display region; and a non-active area corresponding to a region outside of the active area, wherein the active area includes a plurality of signal lines arranged in an array, wherein the non-active area includes a pad region to which a source driver IC is mounted, and a switching structure, wherein the pad region includes a plurality of pads arranged in correspondence with the array of the signal lines, and wherein the switching structure includes: a common reference voltage pad-connection terminal connected to a common reference voltage pad of the display panel; a plurality of reference voltage line-connection terminals connected to a plurality of reference voltage lines of the display panel; and a switching circuit to switch connections between the common reference voltage pad-connection terminal and the plurality of reference voltage line-connection terminals.

According to another embodiment of the present disclosure, provide is an organic light-emitting display device, including: the organic light-emitting display panel of claim 1, wherein the organic-light emitting display panel further includes: a plurality of subpixels, each of the plurality of subpixels having an organic light-emitting diode and a driving transistor driving the OLED are disposed in a matrix pattern, wherein one data line is provided for each row of the subpixels, one or two gate lines provided for each column of the subpixels, one driving voltage line provided for one or more rows of the subpixels, and one reference voltage line provided for each of the one or more rows of the subpixels.

BRIEF DESCRIPTION OF THE DRAWINGS

The above and other objects, features and advantages of the present disclosure will be more clearly understood from the following detailed description when taken in conjunction with the accompanying drawings, in which:

FIG. 4 is a view illustrating a threshold voltage sensing driving mode for a driving transistor of the organic light-emitting display device according to the present disclosure;

FIG. 5 is a view illustrating a mobility sensing driving mode for the driving transistor of the organic light-emitting display device according to the present disclosure;

FIG. 12 is a view illustrating a switching operation of the multiplexer based on a driving mode of the organic light-emitting display panel according to the present disclosure;

DETAILED DESCRIPTION OF THE EMBODIMENTS

Figure 1:
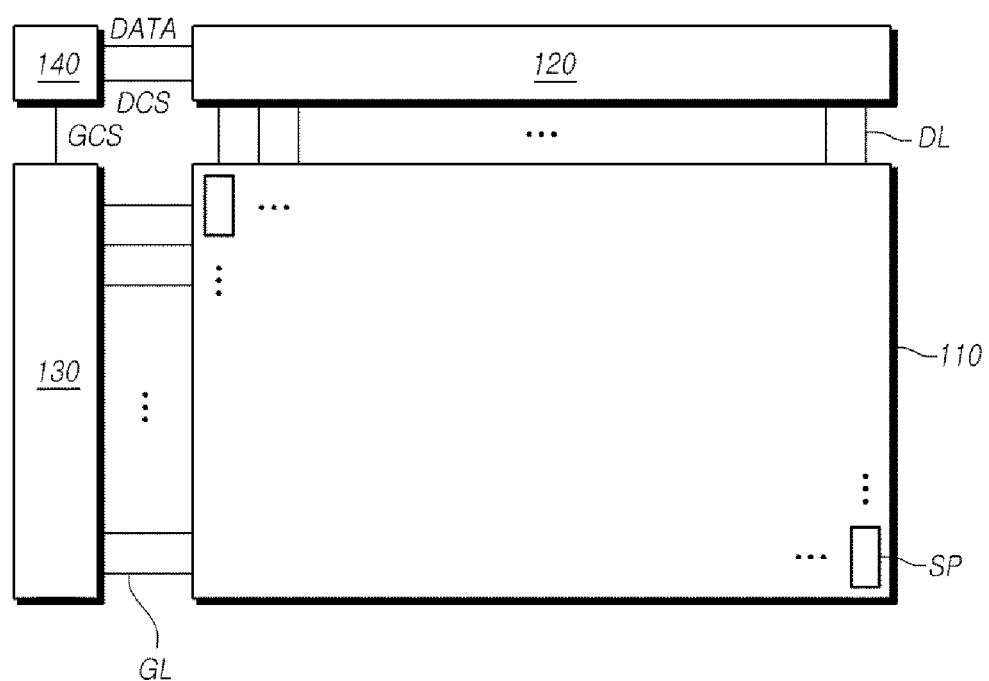
FIG. 1 is a system configuration view of an organic light-emitting display device according to the present disclosure.

Reference will now be made in detail to embodiments of the present disclosure, examples of which are illustrated in the accompanying drawings. Throughout this document, reference should be made to the drawings, in which the same reference numerals and signs will be used to designate the same or like components. In the following description of the present disclosure, detailed descriptions of known functions and components incorporated herein will be omitted in the instance that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected" or "coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 is a system configuration view of an organic light-emitting display (OLED) device 100 according to example embodiments.

Referring to FIG. 1, the OLED device 100 includes an OLED display panel 110 on which a plurality of data lines DL and a plurality of gate lines GL intersecting the plurality of data lines are disposed and a plurality of subpixels SB are also disposed, a data driver 120 driving the plurality of data lines DL, a gate driver 130 driving the plurality of gate lines GL, and a controller 140 controlling the data driver 120 and the gate driver 130.

The controller 140 controls the data driver 120 and the gate driver 130 by supplying a variety of control signals to the data driver 120 and the gate driver 130.

The controller 140 starts scanning based on a timing set in each frame, converts external input image data, outputs converted image data to those suitable for a data signal format used in the data driver 120 and outputs the converted image data, and controls data driving at an appropriate point of time according to the scanning.

Such a controller 140 may be a timing controller used in conventional display technologies, or another controller, including a timing controller, to implement further control functions.

The data driver 120 drives the plurality of data lines DL by supplying data voltages to the plurality of data lines DL. Here, the data driver 120 is referred to as a "source driver."

The data driver 120 may include at least one source driver integrated circuit SDIC to drive the plurality of data lines.

The gate driver 130 sequentially drives the plurality of gate lines GL by sequentially supplying a scanning signal to the plurality of gate lines GL. Here, the gate driver 120 is also referred to as a "scan driver."

The gate driver 130 may include at least one gate driver integrated circuit GDIC.

The gate driver 130 sequentially supplies an on-voltage signal or an off-voltage signal to the plurality of gate lines GL under the control of the controller 140.

When a specific gate line is opened by the gate driver 130, the data driver 120 supplies the image data received from the controller 140 which is converted into a data voltage in analog form, and supplies the converted image data to the plurality of data lines DL.

Although the data driver 120 is positioned on one side (e.g. an upper side or a lower side) of the OLED display panel 110 as in FIG. 1, the data driver may be positioned on opposite sides (e.g. upper and lower sides) of the OLED panel 110 according to a driving scheme, a panel design method, or the like.

Although the gate driver 130 is positioned on one side (e.g. a left side or a right side) of the OLED display panel 110 as in FIG. 1, the gate driver may be positioned on opposite sides (e.g., a left side and a right side) of the OLED panel 110 according to a driving scheme, a panel design method, or the like.

The controller 140 receives a variety of timing signals, as well as input image data, from an external device (e.g. a host system). The variety of timing signals may include a vertical synchronization signal Vsync, a horizontal synchronization signal Hsync, an input data enable signal DE, a clock signal CLK, or the like.

The controller 140 receives timing signals, such as the vertical synchronization signal Vsync, the horizontal synchronization signal Hsync, the input data enable signal DE, the clock signal, or the like, generates a variety of control signals, and outputs the control signals to the data driver 120 and the gate driver 130 in order to control the data driver 120 and the gate driver 130.

For example, the controller 140 may output a variety of gate control signals (GCSs) including a gate start pulse (GSP), a gate shift clock (GSC) signal and a gate output enable (GOE) signal in order to control the gate driver 130.

Here, the gate start pulse (GSP) controls the operation start timing of one or more gate driver ICs of the gate driver 130. The gate shift clock (GSC) signal is a clock signal commonly input to the one or more gate driver ICs to control the shift timing of a scanning signal (gate pulse). The gate output enable (GOE) signal designates the timing information of the one or more gate driver ICs.

The controller 140 outputs a variety of data control signals (DCSs) including a source start pulse (SSP), a source sampling clock (SSC) signal and a source output enable (SOE) signal in order to control the data driver 120.

Here, the source start pulse (SSP) controls the data sampling start timings of one or more source driver ICs, respectively. The source sampling clock (SSC) signal is a clock signal to control the data sampling timings of the source driver ICs, respectively. The source output enable (SOE) signal controls the output timing of the data driver 120.

Each of the source driver ICs SDIC is connected to the bonding pad of the OLED display panel 110 by a tape automated bonding (TAB) method or a chip on glass (COG) method, or is directly disposed on the OLED display panel 110. In some instance, each source driver IC may be integrated with the OLED display panel 110. In addition, each of the source driver ICs SDIC may be embodied in a chip-on-film (COF) method, whereby each source driver IC is mounted on a film connected to the OLED panel 110.

Each of the source driver ICs SDIC includes a shift register, a latch circuit, a digital-to-analog converter (DAC), an output buffer, and the like.

In some instances, each source driver IC SDIC may further include an analog-to-digital converter (ADC).

Each of the gate driver ICs GDIC is connected to the bonding pad of the OLED display panel 110 by a tape automated bonding (TAB) method or a chip on glass (COG) method, or is directly disposed on the OLED display panel 110 in a gate in panel type. In some instances, each gate driver IC GDIC may be integrated with the OLED display panel 110. In addition, each of the gate driver ICs GDIC may be embodied in a chip-on-film (COF) method, whereby each source driver IC is mounted on a film connected to the OLED panel 110.

Each of the gate driver ICs GDIC includes a shift register, a level shifter, and the like.

Each of the subpixels SP disposed on the OLED panel 110 may include circuit elements such as a transistors or the like.

For example, each subpixel SP includes an OLED, and circuit elements, such as a driving transistor driving the OLED.

Types and numbers of the circuit elements of the respective subpixels may be arbitrarily determined according to functions and design methods of the circuit elements.

Figure 2:
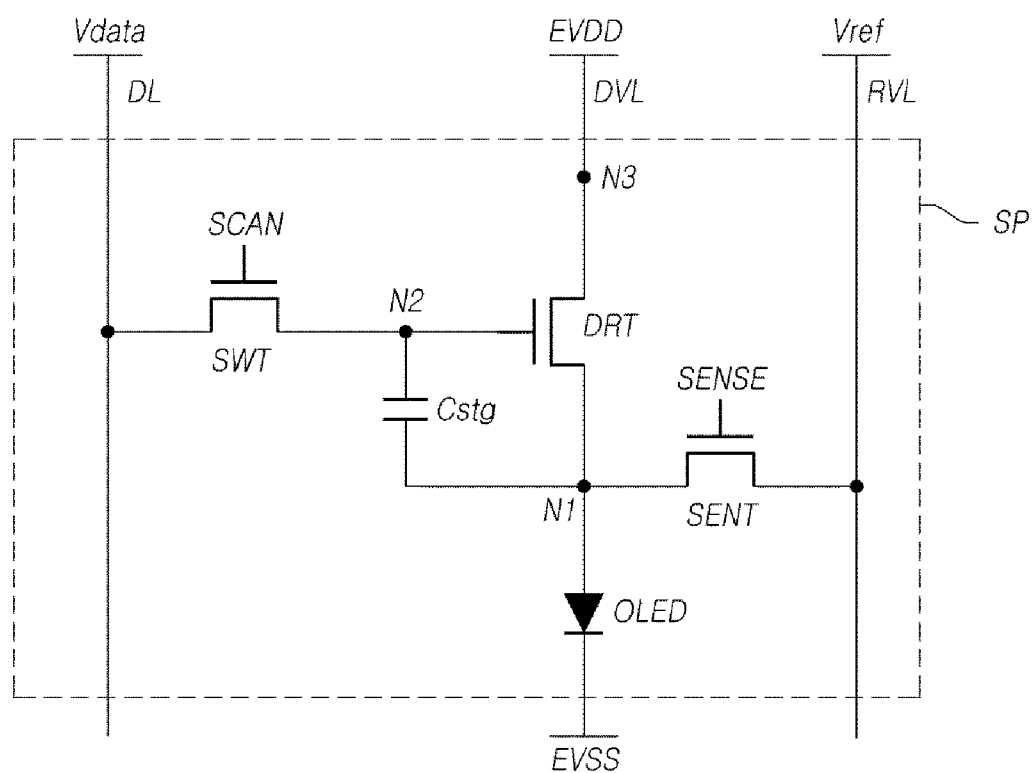
FIG. 2 is a view of a subpixel structure of the organic light-emitting display device according to the present disclosure.
Figure 3:
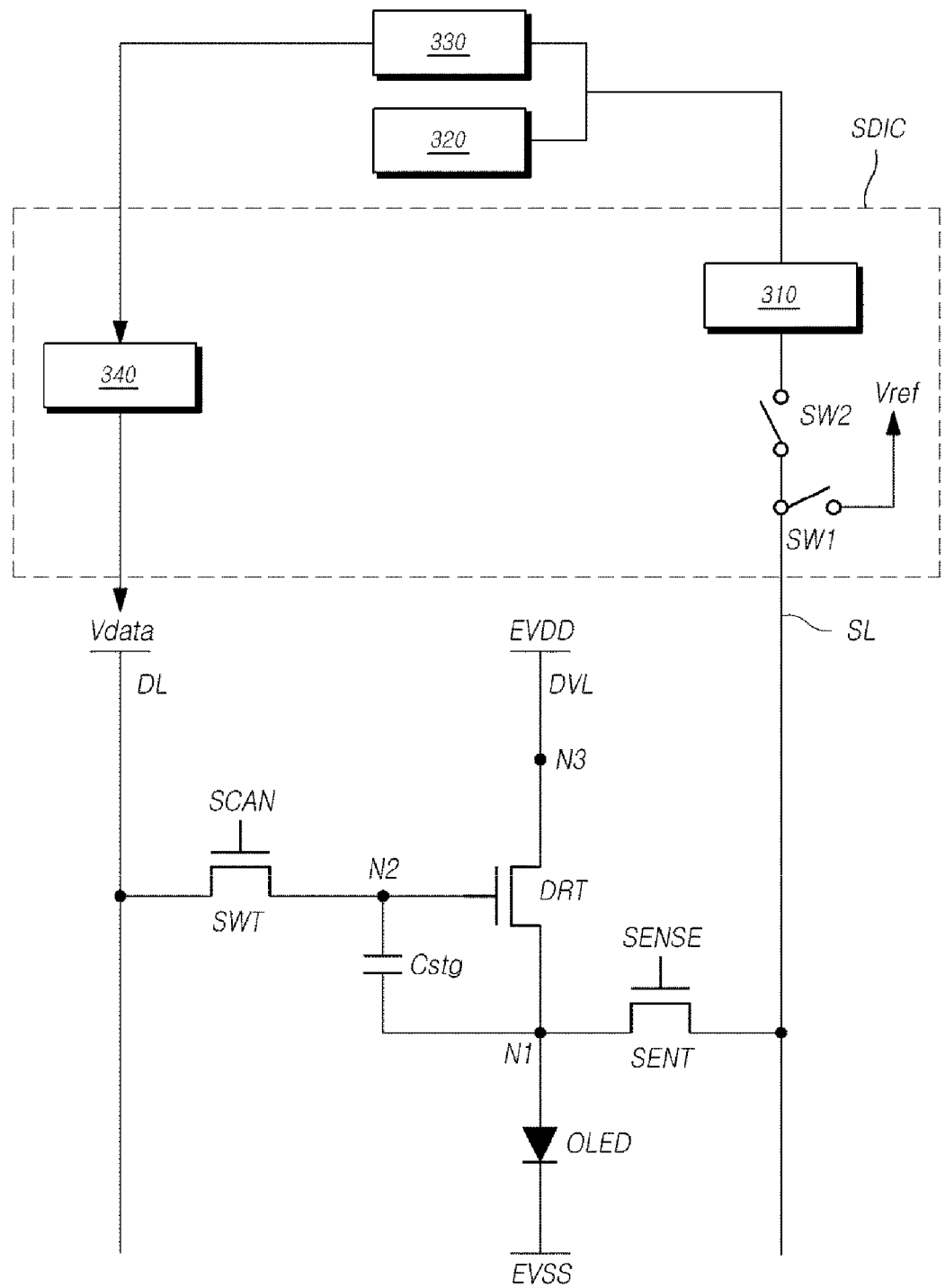
FIG. 3 is a view of a compensation circuit of the organic light-emitting display device according to the present disclosure.

FIG. 2 illustrates an example of the subpixel structure of the OLED display device 100 according to embodiments of the present disclosure, and FIG. 3 illustrates an example of a compensation circuit of the OLED device according to embodiments of the present disclosure.

Referring to FIG. 2, in the OLED display device 100 according to embodiments of the present disclosure, each subpixel may basically include an OLED, a driving transistor DRT driving the OLED, a switching transistor SWT supplying a data voltage to a second node N2 corresponding to a gate node of the driving transistor DRT, and storage capacitor Cstg serving to maintain a predetermined voltage corresponding to a data voltage corresponding to an image signal voltage or a voltage corresponding thereto for a period of a single frame.

The OLED may include a first electrode (e.g. an anode electrode), an organic layer, and a second electrode (e.g. a cathode electrode).

The driving transistor DRT drives the OLED by supplying a driving current to the OLED.

A first node N1 of the driving transistor DRT may be electrically connected to the first electrode of the OLED, and may correspond to a source node or a drain node. A second node N2 of the driving transistor DRT may be electrically connected to a source node or a drain node of the switching transistor SWT, and may correspond to a gate node. A third node N3 of the driving transistor DRT may be electrically connected to a driving voltage line DVL through which a driving voltage EVDD is supplied, and may correspond to a drain node or a source node.

The driving transistor DRT and the switching transistor SWT may be an n-transistor or a p-transistor as shown in FIG. 2.

The switching transistor SWT is electrically connected between a data line DL and the second node N2 of the driving transistor DRT and may be controlled by a scanning signal SCAN applied to the gate node via the gate line.

The switching transistor SWT may be turned on by the scanning signal SCAN to transmit the data voltage Vdata supplied from the data line DL to the second node N2 of the driving transistor DRT.

The storage capacitor Cstg may be electrically connected between the first node N1 and the second node N2 of the driving transistor DRT.

The storage capacitor Cstg is not a parasitic capacitor (e.g. Cgs, Cgd, etc.) that is an internal capacitor disposed between the first node N1 and the second node N2 of the driving transistor DRT, but an external capacitor that is intentionally disposed outside of the driving capacitor DRT.

In the meantime, in the OLED display device 100 according to embodiments of the present disclosure, the circuit elements, such as the OLED, the driving transistor DRT, or the like, may deteriorate along with an increase in driving time of respective subpixels SPs.

Therefore, inherent characteristics (e.g. a threshold voltage, mobility, etc.) of the circuit elements such as the OLED, the driving transistor DRT or the like may change.

Such changes in the characteristics of the circuit elements may produce differences in degrees of luminance of corresponding subpixels. Thus, changes in the characteristics of the circuit elements may be conceptually the same as differences in degrees of luminance of the subpixel.

Further, degrees of changes in characteristics between circuit elements may differ from each other depending on a difference in degrees of deterioration of respective circuit elements.

Such differences in characteristics between circuit elements may lead to differences in degrees of luminance between subpixels. Thus, differences in characteristics between circuit elements may be conceptually the same concept as differences in degrees of luminance between subpixels.

The above-mentioned changes in luminance of subpixels and the differences in luminance between subpixels may lead to problems, such as inaccurate expression of luminance of subpixels, image failure, or the like, arising.

Here, the characteristics of circuit elements (hereinafter also referred to as "subpixel characteristics") may include, for example, a threshold voltage, mobility, and the like of the driving transistor DRT. In some instances, a threshold voltage of the OLED may be included.

The OLED display device 100 according to embodiments may provide a function of sensing (measuring) changes in luminance of subpixels and differences in luminance between subpixels (changes in characteristics of circuit elements and differences in characteristics between circuit elements) and a function of compensating for changes in luminance of subpixels and differences in luminance between subpixels based on a sensed result.

The OLED display device 100 may include a corresponding subpixel structure and a compensation circuit having sensing and compensation configurations in order to provide sensing and compensation functions for changes in luminance of subpixels and differences in luminance between subpixels.

Referring to FIG. 2, each of subpixels, which are disposed on the OLED panel 110 according to embodiments, may include, for example, a sensing transistor SENT, in addition to the OLED, the driving transistor DRT, the switching transistor SWT, and the storage capacitor Cstg.

Referring to FIG. 2, the sensing transistor SENT is electrically connected between the first node N1 of the driving transistor DRT and a reference voltage line RVL supplying a reference voltage Vref, and is controlled by a sensing signal SENSE, i.e. a kind of scanning signal, applied to the gate node.

The sensing transistor SENT is turned on by the sensing signal SENSE to apply the reference voltage Vref supplied via the reference voltage line RVL to the first node N1 of the driving transistor DRT.

In addition, the sensing transistor SENT may be utilized as a voltage sensing path for the first node N1 of the driving transistor DRT.

In the meantime, the scanning signal SCAN and the sensing signal SENSE may be a separate gate signal. In this instance, the scanning signal SCAN and the sensing signal SENSE may be respectively applied to the gate node of the switching transistor SWT and the gate node of the sensing transistor SENT via different gate lines.

In some instances, the scanning signal SCAN and the sensing signal SENSE may be the same gate signal. In this instance, the scanning signal SCAN and the sensing signal SENSE may be commonly applied to the gate node of the switching transistor SWT and the gate node of the sensing transistor SENT via the same gate lines.

Referring to FIG. 3, the OLED display device 100 according to embodiments may include a sensing unit 310, a memory 320, and a compensation unit 330. The sensing unit 310 may be electrically connected to the reference voltage line RVL disposed on the OLED panel 110 so as to sense a variation in characteristics of the OLED and/or a difference in characteristics between subpixels and output sensing data. The memory 320 stores the sensing data therein. The compensation unit 330 carries out a compensation process to compensate for the variations in characteristics of the OLED and/or the difference in characteristics between subpixels based on the sensing data.

The sensing unit 310 may include at least one analog-to-digital converter (ADC).

Respective ADCs may be internally or externally provided to the source drive ICs SDIC.

If the sensing unit 310 is implemented with the ADC in the source driver IC serving as a transmitter of the reference voltage line RVL, the sensing unit is able to effectively provide image driving and sensing driving, because the reference voltage line RVL is commonly used during image driving and the sensing driving.

The compensation unit 330 may be internally or externally provided to the controller 140.

The sensing data output from the sensing unit 310 may have a low voltage differential signaling (LVDS) data format, for example.

The OLED display device 100 according to embodiments of the present disclosure may further include first and second switches SW1 and SW2 to control the sensing driving, i.e. to set a voltage state of the first node N1 of the driving transistor DRT in a subpixel to a state required for sensing subpixel characteristics.

Supply of the reference voltage Vref to the reference voltage line RVL may be controlled by the first switch SW1.

When the first switch SW1 is turned on, the reference voltage Vref may be applied to the first node N1 of the driving transistor DRT via the sensing transistor SENT turned-on through the reference voltage line RVL.

In the meantime, when a voltage of the first node N1 of the driving transistor DRT has a voltage state reflecting characteristics of a subpixel, a voltage of the reference voltage line RVL, which may have the same potential as that of the first node N1 of the driving transistor DRT, may also have a voltage state that reflects characteristics of the subpixel. Here, a line capacitor formed on the reference voltage line RVL may be charged with the voltage that reflects the characteristics of the subpixel.

When the voltage of the first node N1 of the driving transistor DRT has the voltage state that reflects the characteristics of the subpixel, the second switch SW2 is turned on so that the sensing unit 310 and the reference voltage line RVL can be connected together.

Therefore, the sensing unit 310 senses the voltage of the reference voltage line RVL that shows the voltage state reflecting the characteristics of the subpixel, i.e. the voltage of the first node N1 of the driving transistor DRT. Here, the reference voltage line RVL is also referred to as a "sensing line".

Such a reference voltage line RVL may be arranged, for example, in an amount of one per row of subpixels or one per two or more rows of subpixels.

For example, when a pixel is composed of four subpixels (red, white, green, and blue subpixels), a reference voltage line RVL may be arranged in an amount of one per each row of pixels including four rows of subpixels (rows of red, white, green, and blue subpixels).

When connected to the reference voltage line RVL, the sensing unit 310 senses the voltage of the first node N1 of the driving transistor DRT (the voltage of the reference voltage line RVL or the voltage charged in the line capacitor on the reference voltage line RVL).

The voltage sensed by the sensing unit 310 may be a threshold voltage Vth of the driving transistor DRT or a voltage value Vdata-Vth or Vdata-$\Delta$Vth including a threshold voltage differential $\Delta$Vth, or a voltage value for sensing mobility of the driving transistor DRT.

A brief description will now be made of threshold voltage-sensing driving and mobility-sensing driving for the driving transistor DRT.

FIG. 4 is a view illustrating a threshold voltage-sensing driving mode for the driving transistor DRT of the OLED display device 100.

During the threshold voltage-sensing driving for the driving transistor DRT, the first and second nodes N1 and N2 of the driving transistor DRT are initialized to a reference voltage Vref and a data voltage Vdata for the threshold voltage-sensing driving, respectively.

Thereafter, as the first switch SW1 is in an off state, the first node N1 of the driving transistor DRT floats.

Accordingly, the voltage of the first node N1 of the driving transistor DRT is boosted.

The voltage of the first node N1 of the driving transistor DRT is gradually increased to a saturated state.

The saturated voltage of the first node N1 of the driving transistor DRT may correspond to the difference between the data voltage Vdata and the threshold voltage Vth or the difference between the data voltage Vdata and the threshold voltage differential $\Delta$Vth.

When the voltage of the first node N1 of the driving transistor DRT is saturated, the sensing unit 310 senses the saturated voltage of the first node N1 of the driving transistor DRT.

The voltage Vsen sensed by the sensing unit 310 may be a voltage Vdata-Vth obtained by subtracting the threshold voltage Vth from the data voltage Vdata, or a voltage Vdata-ΔVth obtained by subtracting the threshold voltage differential ΔVth from the data voltage Vdata.

FIG. 5 is a view illustrating the mobility-sensing driving mode for the driving transistor DRT of the OLED display device 100 according to embodiments of the present disclosure.

During the mobility-sensing driving, the first and second nodes N1 and N2 of the driving transistor DRT are initialized to the reference voltage Vref and the data voltage Vdata for the mobility-sensing driving, respectively.

Thereafter, as the first switch SW1 is opened, the first node N1 of the driving transistor DRT floats.

Accordingly, the voltage of the first node N1 of the driving transistor DRT starts to be boosted.

A boosting rate of the voltage of the first node N1 of the driving transistor DRT (a variation rate ΔV of a voltage increase over time) changes depending on a current capacity, i.e. mobility, of the driving transistor DRT.

That is, as the driving transistor DRT has a greater current capacity (mobility), the voltage of the first node N1 of the driving transistor DRT increases more sharply.

After the voltage of the first node N1 of the driving transistor DRT has been increased for a predetermined period of time, the sensing unit 310 senses the increased voltage of the first node N1 of the driving transistor DRT (i.e. the voltage of the reference voltage line RVL that is also increased along with the increase in the voltage of the first node N1 of the driving With the sensing driving for the threshold voltage or mobility, the sensing unit 310 converts a sensed voltage Vsen for sensing the threshold voltage or mobility to a digital value and produces and outputs sensing data including the converted digital value (sensed value).

The sensing data output from the sensing unit 310 may be stored in the memory 320, or may be provided to the compensation unit 330.

The compensation unit 330 may determine the characteristics (e.g. a threshold voltage, mobility) or changes in the characteristics (e.g. changes in the threshold voltage or mobility) of the driving transistor DRT in corresponding subpixels, based on the sensing data stored in the memory 320 or provided from the sensing unit 310, and then carry out a process of compensating for the characteristics.

Here, the changes in the characteristics of the driving transistor DRT may correspond to changes in current sensing data relative to previous sensing data or reference sensing data.

In addition, a difference in the characteristics between the driving transistors DRT may be determined by comparing the characteristics or changes in the characteristics between the driving transistors DRT. In the instance in which the changes in the characteristics of the driving transistor DRT correspond to the changes of the current sensing data relative to the reference sensing data, the difference in the characteristics between the driving transistors DRT (i.e. the difference in luminance levels of subpixels) may be determined based on the changes in the characteristics of the driving transistor DRT.

The process of compensating for the characteristics may include a process of compensating for a threshold voltage of the driving transistor DRT, and a process of compensating for mobility of the driving transistor DRT.

The compensation process for the threshold voltage may include a process of calculating a compensation value for compensating for the difference in the threshold voltage (change in the threshold voltage), and storing the calculated compensation value in the memory 320, or processing corresponding image data with the calculated compensation value.

The compensation process for the mobility may include a process of calculating a compensation value for compensating for the difference in the mobility (change in the mobility), and storing the calculated compensation value in the memory 320, or processing corresponding image data with the calculated compensation value.

The compensation unit 330 may process the image data with the compensation process for the threshold voltage or mobility, and supply the processed data to a corresponding source driver IC SDIC in the data driver 120.

Accordingly, the corresponding source driver IC SDIC converts the processed data processed by the compensation unit 330 to a data voltage via a digital-to-analog converter (DAC) 340, and supplies the converted data voltage to a corresponding subpixel, so that the compensation for the characteristics (threshold voltage, mobility) of the subpixel is actually performed.

With the compensation for the characteristics of the subpixels, the difference in luminance between the subpixels is reduced or prevented, thereby improving image quality.

In the meantime, a plurality of subpixels SP defined by a plurality of data lines DL and a plurality of gate lines GL are arranged in a matrix pattern in the OLED panel 110.

In addition, to drive the subpixels SP, respective subpixels SP further require a driving voltage EVDD and a reference voltage Vref in addition to the data voltage and the scanning signal.

Thus, in addition to the plurality of data lines DL and the plurality of gate lines GL, a plurality of driving voltage lines DVL and a plurality of reference voltage lines RVL may be further arranged in the OLED panel 110.

For example, in the OLED panel 110, one data line DL may be provided for each row of subpixels; one or two gate lines GL may be provided for each column of subpixels; one driving voltage line DVL may be provided for one or more rows of subpixels; and one reference voltage line RVL may be provided for each of the one or more rows of subpixels.

An arrangement of signal lines in the OLED panel 110 will now be described with reference to FIG. 6.

Figure 6:
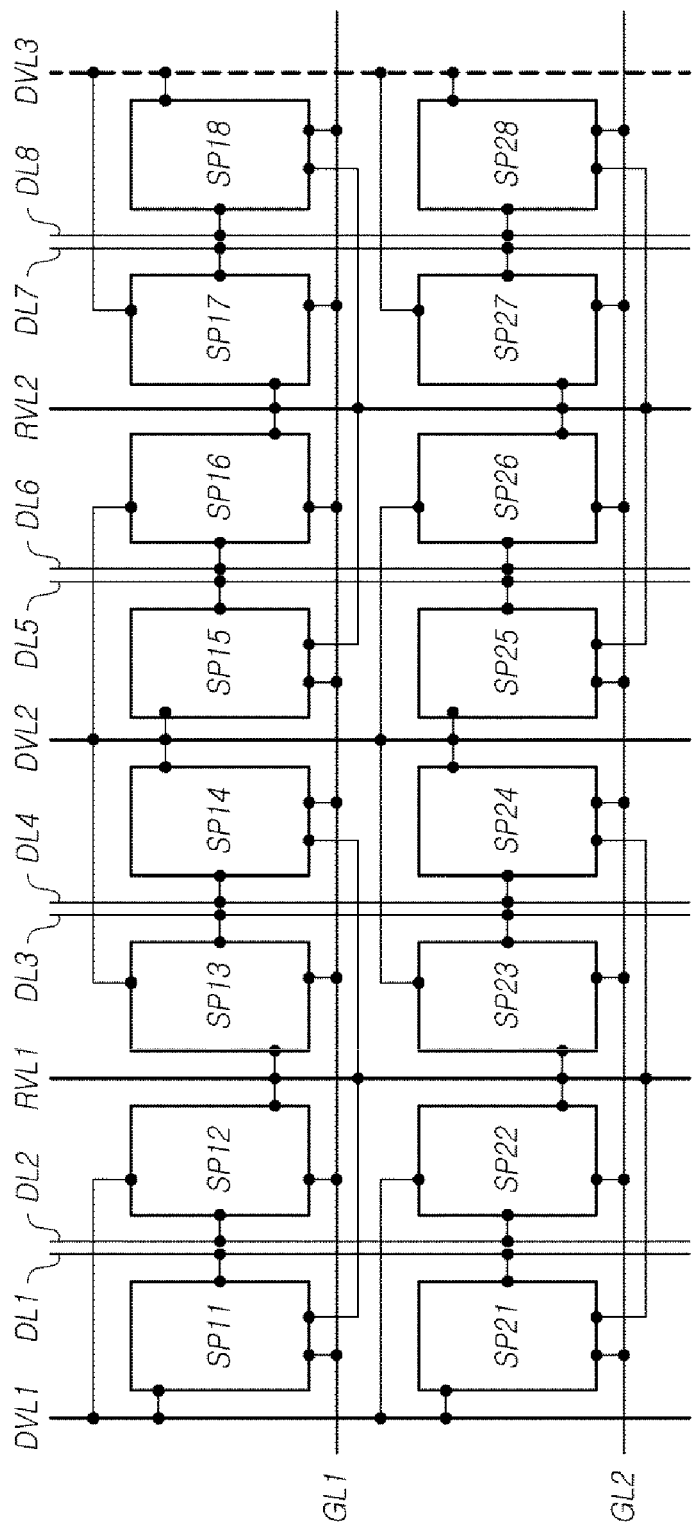
FIG. 6 is a view of a signal line layout of an organic light-emitting display panel according to the present disclosure.

FIG. 6 illustrates an example of an arrangement of signal lines in the OLED panel 110 according to embodiments of the present disclosure, wherein the signal lines are arranged in a region in which eight rows of subpixels are disposed.

Referring to FIG. 6, 16 subpixels SP11, SP12, . . . , and SP18, Sp21, SP22, . . . , SP28 are provided in the region in which eight rows of subpixels are arranged.

In the region in which eight rows of subpixels are arranged, column lines, such as eight data lines DL1, . . . , and DL8, two driving voltage lines DVL1, DVL2, and two reference voltage lines RVL1, RVL2, are arranged.

FIG. 6 illustrates an example structure of subpixels in which a switching transistor SWT and a sensing transistor SENT in each of the subpixels receive a scanning signal SCAN and a sensing signal SENSE via the same gate line, wherein one gate line may be provided for each column of subpixels.

That is, the subpixels SP11, SP12, . . . , and SP18 included in a first column of subpixels are supplied with a gate signal (a scanning signal, a sensing signal) from a first gate line GL1. The subpixels SP21, SP22, . . . , and SP28 included in a second column of subpixels are supplied with a gate signal (a scanning signal, a sensing signal) from a second gate line GL2.

Each of eight data lines DL1, ..., and DL8 is respectively arranged to a row of subpixels.

Referring to FIG. 6, each of the two driving voltage lines DVL1 and DVL2 is respectively arranged to four rows of subpixels.

For example, DVL2 supplies the driving voltage EVDD to the subpixels SP13, SP14, SP15, SP16, ... included in third, fourth, fifth, and sixth rows of subpixels.

Referring to FIG. 6, each of the two reference voltage lines RVL1 and RVL2 is respectively arranged to four rows of subpixels.

For example, RVL1 supplies the driving voltage EVDD to the subpixels SP11, SP12, SP13, SP14, ... included in first, second, third, and fourth rows of subpixels.

In addition, RVL1 is used as a sensing line through which the subpixels SP11, SP12, SP13, SP14, ... included in the first, second, third, and fourth rows of subpixels are sensed.

Referring to FIG. 6, for symmetry of a panel structure, two data lines DL1 and DL2 are arranged between the first and second rows of subpixels. The first driving voltage line DVL1 is disposed on one side of the first row of subpixels, and the second driving voltage line DVL2 is disposed on the other side of the fourth row of subpixels. Further, one reference voltage line RVL1 is disposed between the second and third rows of subpixels.

An example arrangement of the signal lines arranged in a line array shown in FIG. 6 will now be described.

Figure 7:
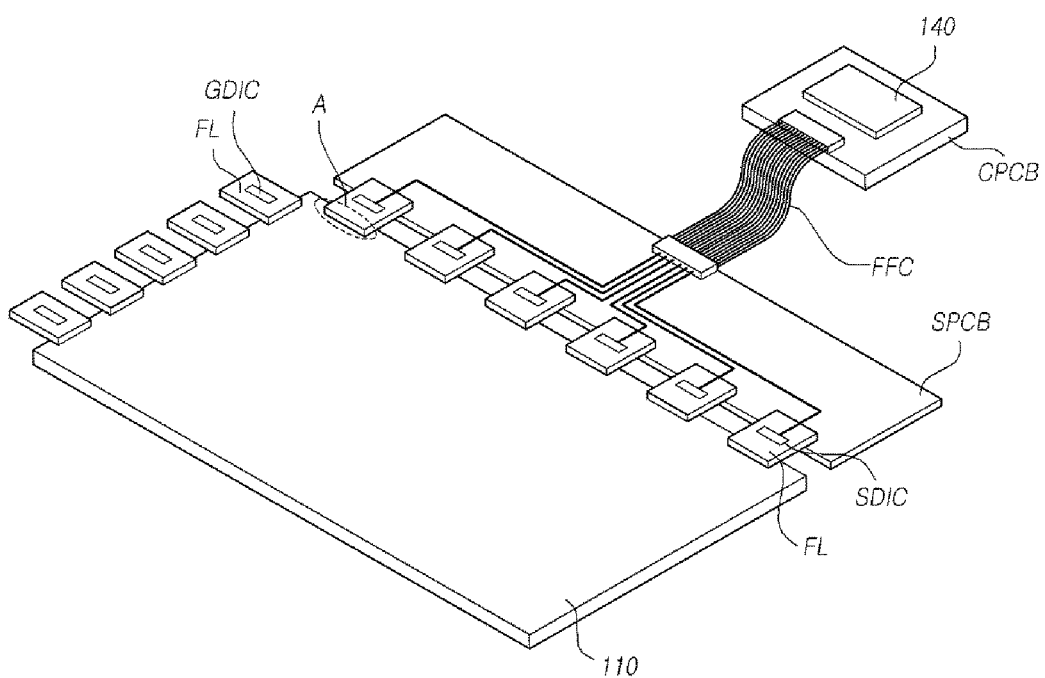
FIG. 7 is a view illustrating the realization of the organic light-emitting display device according to the present disclosure.

FIG. 7 is an illustrative view of an organic light-emitting display device 100 according to embodiments of the disclosure.

Referring to FIG. 7, a data driver 120 may include at least one source driver integrated circuit SDIC, and a gate driver 13C may include at least one gate driver integrated circuit GDIC.

Each of the source driver ICs SDIC may be embodied in a chip on film (COF) method.

In this instance, each of the source driver ICs SDIC is mounted on a film FL connected to one side of the organic light-emitting display panel 110.

Each of the gate driver ICs GDIC may be embodied in a chip on film (COF) method.

In this instance, each of the gate driver ICs GDIC is mounted on a film FL connected to one side of the organic light-emitting display panel 110.

The organic light-emitting display device 100 according to embodiments of the disclosure may include at least one source printed circuit board (PCB) SPCB required for circuit connection for at least one source driver IC SDIC, and a control PCB CPCB to which control components and a variety of electric devices are mounted.

A film to which the source driver IC SDIC is mounted may be connected to one side of the at least one source PCB.

The control PCB CPCB may be connected with the other side of the at least one source PCB through a flexible flat cable (FFC).

The at least one source PCB SPCB and the control PCB CPCB may be integrated into a single PCB.

In the meantime, the organic light-emitting display panel 110 consists of an active area A/A corresponding to an image display region, and a non-active area N/A corresponding to a region outside of the active area A/A.

The non-active area N/A includes a pad region to which a source driver IC SDIC mounted film FL is bonded.

The pad region on the non-active area N/A of the organic light-emitting display panel 110 will now be described in detail with reference to FIG. 8.

Figure 8:
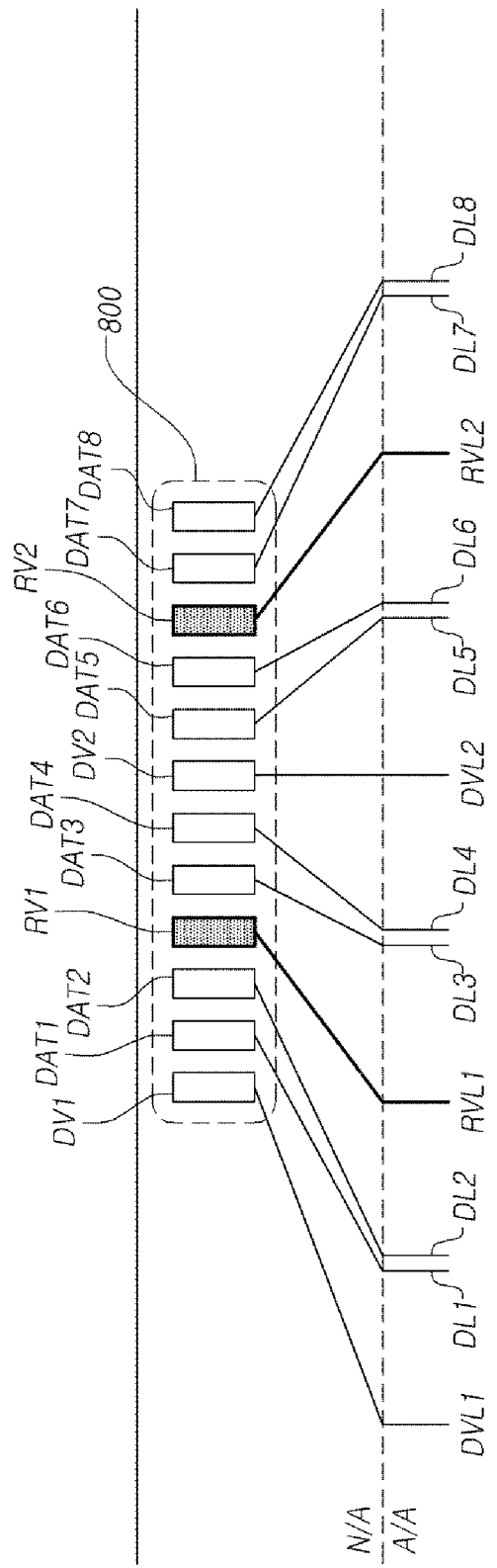
FIG. 8 is a view illustrating a part of a pad region of the organic light-emitting display panel according to the present disclosure.

FIG. 8 is a view illustrating a portion of pad region 800 of the organic light-emitting display panel 110 according to embodiments.

Referring to FIG. 8, the active area A/A may include signal lines DVL1, DL1, DL2, RVL1, DL3, DL4, DVL2, DL5, DL6, RVL2, DL7, and DL8 that are arranged in a signal line array shown in FIG. 6.

Referring to FIG. 8, the non-active area N/A is provided with a pad region 800 on which pads DV1, DAT1, DAT2, RV1, DAT3, DAT4, DV2, DAT5, DAT6, RV2, DAT7, and DAT8 bonded with film pads of the SDIC-mounted film FL are positioned.

The pads DV1, DAT1, DAT2, RV1, DAT3, DAT4, DV2, DAT5, DAT6, RV2, DAT7, and DAT8 positioned on the pad region 800 of the non-active area N/A may be arranged in correspondence with an array of signal lines DVL1, DL1, DL2, RVL1, DL3, DL4, DVL2, DL5, DL6, RVL2, DL7, and DL8 in the active area A/A.

The sizes of the pads DV1, DAT1, DAT2, RV1, DAT3, DAT4, DV2, DAT5, DAT6, RV2, DAT7, and DAT8 positioned on the pad region 800 in the non-active area N/A may be the same, or otherwise may differ from each other depending on types of voltage concerned.

Figure 9:
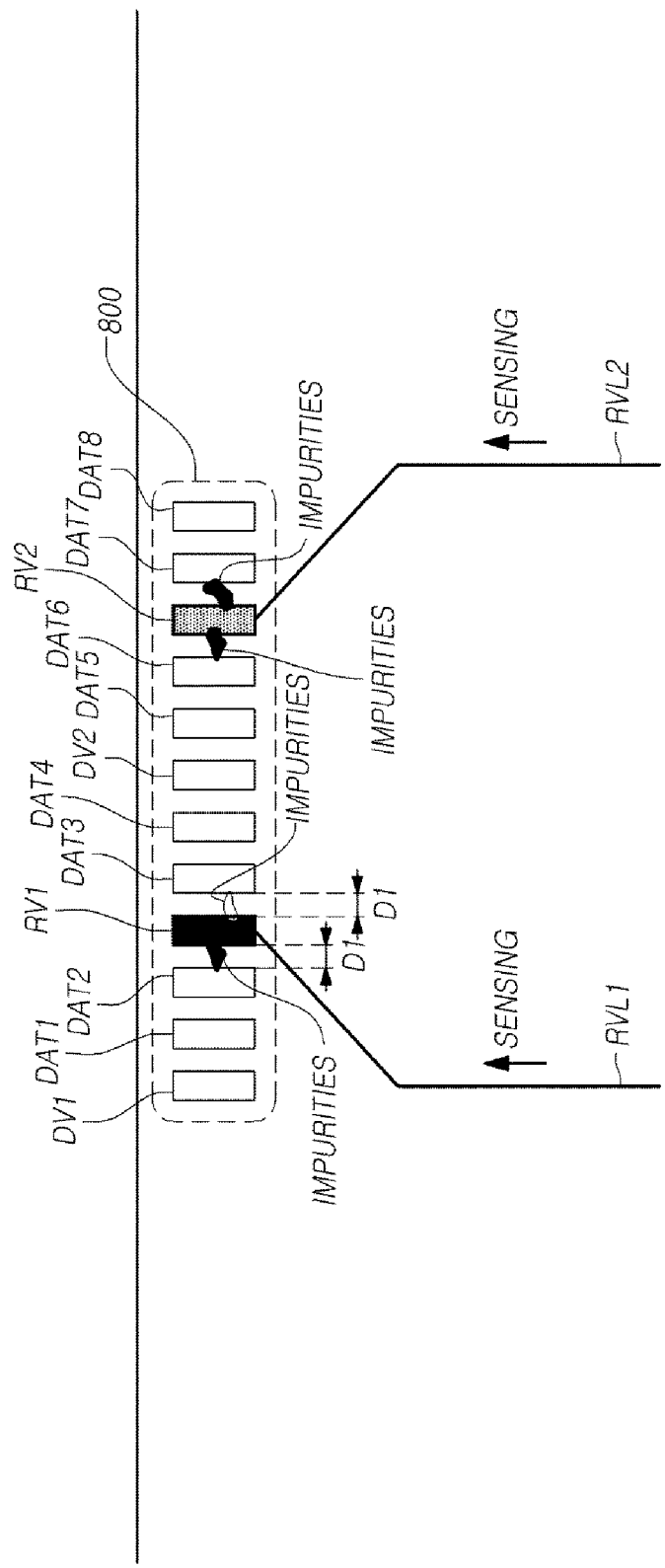
FIG. 9 is a view illustrating a short circuit phenomenon caused by foreign objects between a reference voltage pad and an adjacent pad in the pad region of the organic light-emitting display panel according to the present disclosure.

FIG. 9 is a view showing a short circuit phenomenon that occurs due to foreign objects between the reference voltage pads RV1, RV2 and neighboring pads DAT2, DAT3, DAT6, and DAT7 in the pad region of the organic light-emitting display panel 110 according to embodiments.

Referring to FIG. 9, in the pad region 800, the first reference voltage pad RV1 is disposed adjacent to the second data pad DAT2 and the third data pad DAT 3.

When the organic light-emitting display device 100 requires both high resolution and a multi-function, distances D1 of the first reference voltage pad RV1 to the second data pad DAT2 and to the third data pad DAT3 are essentially made smaller.

In this instance, there is an increased possibility that foreign objects are present between the first reference voltage pad RV1 and the second data pad DAT2 or between the first reference voltage pad RV1 and the third data pad DAT3.

If foreign objects are present between the first reference voltage pad RV1 and the second data pad DAT2 and/or between the first reference voltage pad RV1 and the third data pad DAT3, a short circuit occurs between the first reference voltage pad RV1 and the second data pad DAT2 and/or between the first reference voltage pad RV1 and the third data pad DAT3.

Thus, a problem may occur that, during the image driving or sensing driving, a supply of a data voltage to the second data line DL2 and/or the third data line DL3 through the second data pad DAT2 and/or the third data pad DAT3 becomes abnormal.

Further, a problem may also occur that, during the image driving or sensing driving, a supply of a reference voltage to the first reference voltage line RVL1 of the active area A/A through the first reference voltage pad RV1 becomes abnormal.

In the meantime, when the sensing unit 310 senses the voltage of the first reference voltage line RVL1 according to the sensing driving, the sensing unit 310 senses a voltage of the first reference voltage line RVL1 (i.e. a voltage of the first node N1 of the driving transistor DRT) connected via the first reference voltage pad RV1. Here, if the first reference voltage pad RV1 is short-circuited with at least one of the second data pad DAT2 and the third data pad DAT3, the sensing unit 310 obtains an inaccurate sensing value.

Thus, an inaccurate compensation is carried out for rows of subpixels able to be connected to the first reference voltage line RVL1, a failed image-forming phenomenon may occur on an image-forming region in which rows of subpixels able to be connected to the first reference voltage line RVL1 are disposed. Such a failed image-forming phenomenon is called "line defect".

The organic light-emitting display panel 110 according to embodiments of the present disclosure thus includes unique pad and reference voltage switching structures for protecting reference voltage pads.

Figure 10:
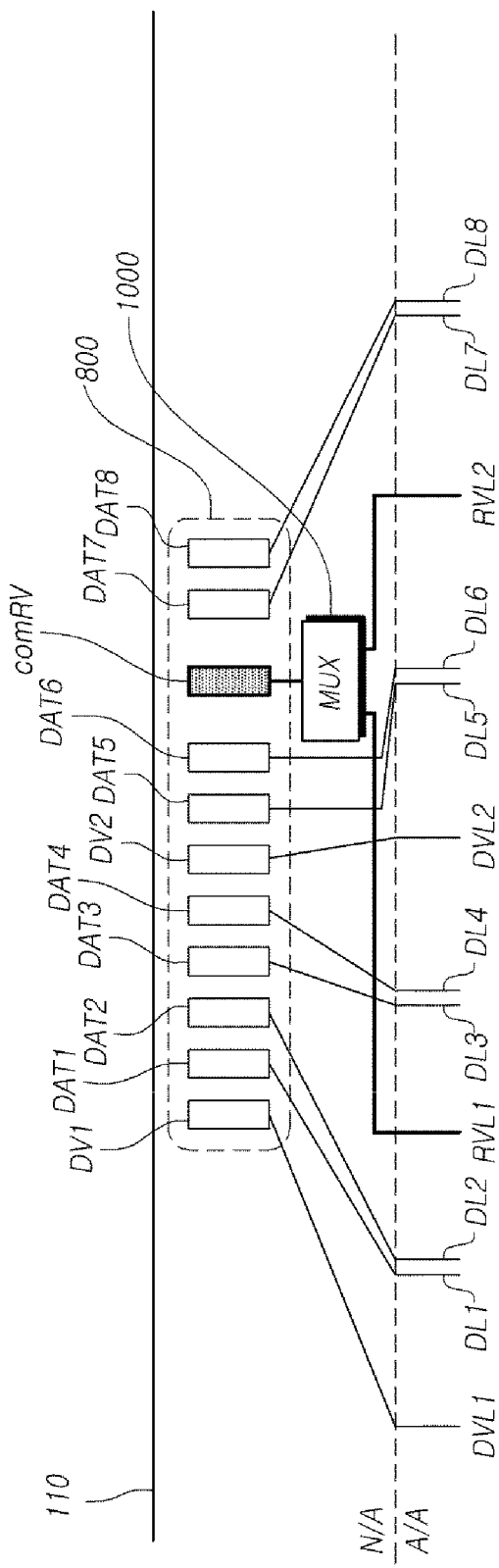
FIG. 10 is a view illustrating a pad structure and a multiplexer for protecting the reference voltage pad in the organic light-emitting display panel according to the present disclosure.
Figure 11:
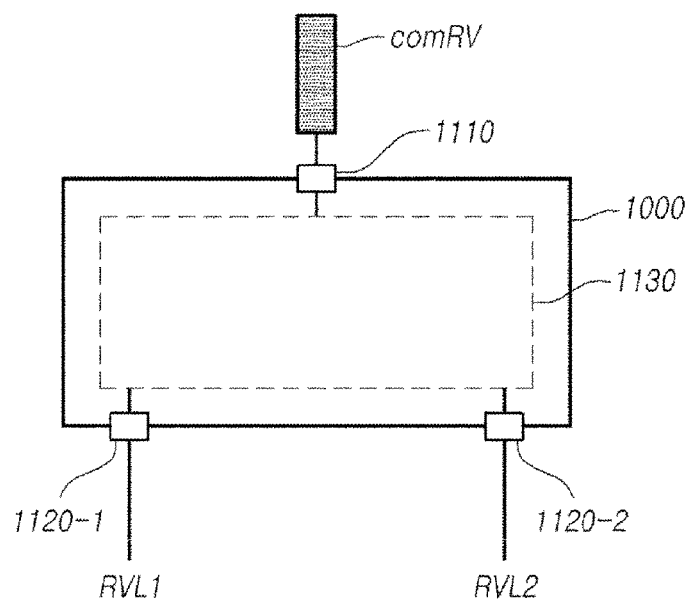
FIG. 11 is a view illustrating the multiplexer located at the organic light-emitting display panel according to the present disclosure.

FIG. 10 is a view illustrating pad and switching structures of the organic light-emitting display panel 110 for protecting reference voltage pads, and FIG. 11 is a view illustrating a multiplexer 1000 as the switching structure in the organic light-emitting display panel 110.

Referring to FIG. 10, the organic light-emitting display panel 110 has the pad structure and the switching structure for protecting the reference voltage pads.

Referring to FIG. 10, to drive a plurality of subpixels SP, each of the plurality of subpixels having an organic light-emitting diode (OLED) and a driving transistor DRT driving the OLED, one data line DL may be provided for each row of subpixels, one or two gate lines GL may be provided for each column of subpixels, one driving voltage line DVL may be provided for one or more rows of subpixels, and one reference voltage line RVL may be provided for one or more rows of subpixels, in the active area A/A of the organic light-emitting display panel 110.

The reference voltage line RVL provided on the organic light-emitting display panel 110 may be electrically connected to the sensing unit 310.

In the meantime, the non-active area N/A of the organic light-emitting display panel 110 may have the switching structure serving to divide and output a reference voltage Vref input to a single voltage input point to two or more voltage output points or selectively output the reference voltage to one of the two or more reference voltage output points, or to transmit one of voltages of two or more reference voltage lines to the sensing unit 310, in order to protect the reference voltage pads.

Such a switching structure may be embodied with one or more multiplexers 1000.

Referring to examples of FIGS. 10 and 11, each of the multiplexers 1000 may include a single common reference voltage pad-connection terminal 1110 serving as a reference voltage-input point and a sensing voltage-output point, n reference voltage line-connection terminals 1120-1, 1120-2, . . . serving as a reference voltage-input point and a sensing voltage-output point, and a switching circuit 1130 serving to switch connections between the single common reference voltage pad-connection terminal 1110 and the n reference voltage line-connection terminals 1120-1, 1120-2, . . . .

Here, n is the number of the reference voltage lines RVL connected to one multiplexer 1000, wherein n is a natural number of 2 or more.

For the sake of easy explanation, it is assumed in the following description that one multiplexer 1000 was connected to two reference voltage lines RVL1, RVL2. That is, it is assumed that one multiplexer 1000 includes two reference voltage line-connection terminals 1120-1, 1120-2.

Referring to FIG. 10, in the organic light-emitting display panel 110, there are two (i.e. n=2) reference voltage lines RVL1, RVL2 on a basis of eight rows of subpixels.

Thus, the pad region of the non-active area N/A may be provided with two (i.e. n=2) reference voltage pads RV1, RV2 corresponding to the two reference voltage lines RVL1, RVL2 as in FIG. 8.

However, to protect the reference voltage pads, the pad region 800 of the non-active area N/A of the organic light-emitting display panel 110 may be provided with a single common reference voltage pad comRV, instead of the two reference voltage pads RV1, RV2, as illustrated in FIG. 10.

According to the above-mentioned pad structure and switching structure, the single common reference voltage pad-connection terminal 1110 of the multiplexer 1000 is electrically connected to the single common reference voltage pad comRV provided on the non-active area N/A.

The two (i.e. n=2) reference voltage line-connection terminals 1120-1, 1120-2 of the multiplexer 1000 may be electrically connected to the two reference voltage lines RVL1, RVL2 provided on the active area A/A of the organic light-emitting display panel 110.

The switching circuit 1130 of the multiplexer 1000 serves to switch connections between the single common reference voltage pad-connection terminal 1110 and the 2 (i.e. n=2) reference voltage line-connection terminals 1120-1, 1120-2.

As described before, with the pad structure in which the single common reference voltage pad comRV is provided instead of the two reference voltage pads RV1, RV2, and the multiplexer 1000 for connections between the single common reference voltage pad comRV and the two reference voltage lines EVL1, RVL2, the number of the reference voltage pads provided in the pad region 800 is reduced, thereby reducing a possibility of a short circuit caused by foreign objects between the common reference voltage pad comRV and an adjacent pad.

Accordingly, accurate image driving may be obtained using the n reference voltage lines RVL1, RVL2, . . . , RVLn, and an accurate sensing operation may also be obtained through the two reference voltage lines RVL1, RVL2.

An array structure of signal lines in the active area A/A and a pad structure in the pad region 800 of the non-active area N/A will now be described again in detail on a basis of eight rows of subpixels with reference to FIG. 10.

Referring to FIG. 10, in eight rows of subpixels, the active area A/A includes a first driving voltage line DVL1, first and second data lines DL1, DL2, a first reference voltage line RVL1, third and fourth data lines DL3, DL4, a second driving voltage line DVL2, fifth and sixth data lines DL5, DL6, a second reference voltage line RVL2, and seventh and eighth data lines DL7, DL8 disposed sequentially.

Further, the pad region 800 of the non-active area N/A includes a first driving voltage pad DV1, first to fourth data pads DAT1, DAT2, DAT3, DAT4, a second driving voltage pad DV2, fifth and sixth data pads DAT5, DAT6, a common reference voltage pad comRV, and seventh and eighth data pads DAT7, DAT8 disposed sequentially.

Referring to FIG. 10, the first and second driving voltage lines DVL1, DVL2 are respectively connected to the first and second driving voltage pads DV1, DV2.

The first to eight data lines DL1, DL2, DL3, DL4, DL5, DL6, DL7, DL8 are respectively connected to the first to eight data pads DAT1, DAT2, DAT3, DAT4, DAT5, DAT6, DAT7, DAT8.

Further, the first and second reference voltage lines RVL1, RVL2 are respectively connected to the common reference voltage pad comRV through the multiplexer 1000.

As described before, with the unique pad structure in which the single common reference voltage pad comRV is provided instead of the two reference voltage pads RV1, RV2, the number of the reference voltage pads provided in the pad region 800 is reduced, thereby reducing a possibility of a short circuit caused by foreign objects between the common reference voltage pad comRV and an adjacent pad.

FIG. 12 is a view illustrating a switching operation of the multiplexer 1000 according to a driving mode of the organic light-emitting display panel 110.

Referring to FIG. 12, the switching circuit 1130 is operated to connect all of the two (i.e. n=2) reference voltage line-connection terminals 1120-1, 1120-2 to the single common reference voltage pad-connection terminal 1110 for a period of image driving.

Referring to FIG. 12, the switching circuit 1130 may be operated to connect, to the single common reference voltage pad-connection terminal 1110, a specified reference voltage line-connection terminal 1120-1 electrically connected to a subpixel to be sensed, from the two (i.e. n=2) reference voltage line-connection terminals 1120-1, 1120-2, for a period of sensing operation.

As such, as the specified reference voltage line-connection terminal 1120-1 and the specified reference voltage line RVL1 are connected, the sensing unit 310 required to be connected to the specified reference voltage line RVL1 according to the sensing driving timing may be connected to the specified reference voltage line RVL1 electrically connected to the specified reference voltage line-connection terminal 1120-1.

Thus, the sensing unit 310 senses a voltage of the specified reference voltage line RVL1 as a voltage of the first node N1 of the driving transistor DRT in a target subpixel connected to the specified reference voltage line RVL1.

As set forth above, although the pad structure is designed to have the single common reference voltage pad comRV instead of the two reference voltage pads RV1, RV2, the image driving and sensing operation may be normally carried out.

Figure 13:
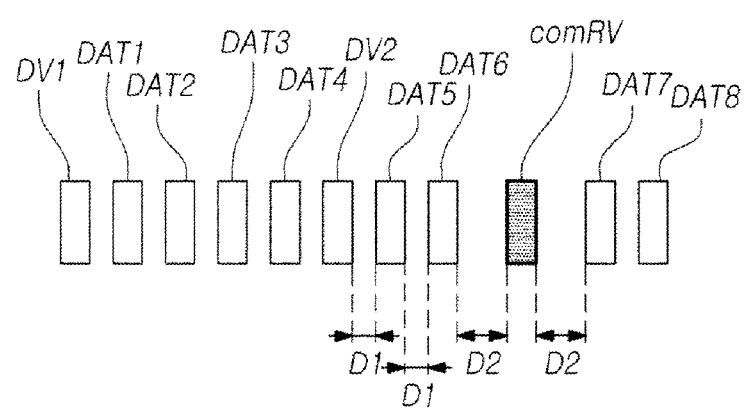
FIG. 13 is a view illustrating structural characteristics of the pad structure for protecting the reference voltage pad in the organic light-emitting display panel according to the present disclosure.

FIG. 13 is a view illustrating structural features of the pad structure for protecting the reference voltage pads in the organic light-emitting display panel 110.

Referring to FIG. 13, a distance D2 between the common reference voltage pad comRV and an adjacent pad DAT6, DAT7 may be greater than a distance of other pads.

Here, the distance of other pads includes a distance D1 between the driving voltage pad and the data pad and a distance D1 between the data pads.

As set forth above, with the configuration in which the distance D2 between the common reference voltage pad comRV and an adjacent pad DAT6, DAT7 is made greater than the distance D1 between other pads (i.e. D2>D1), even when foreign objects are present between the common reference voltage pad comRV and an adjacent pad DAT6, DAT7, a possibility of a short circuit occurring between the common reference voltage pad comRV and the adjacent pad DAT6, DAT7 may be reduced.

Figure 14:
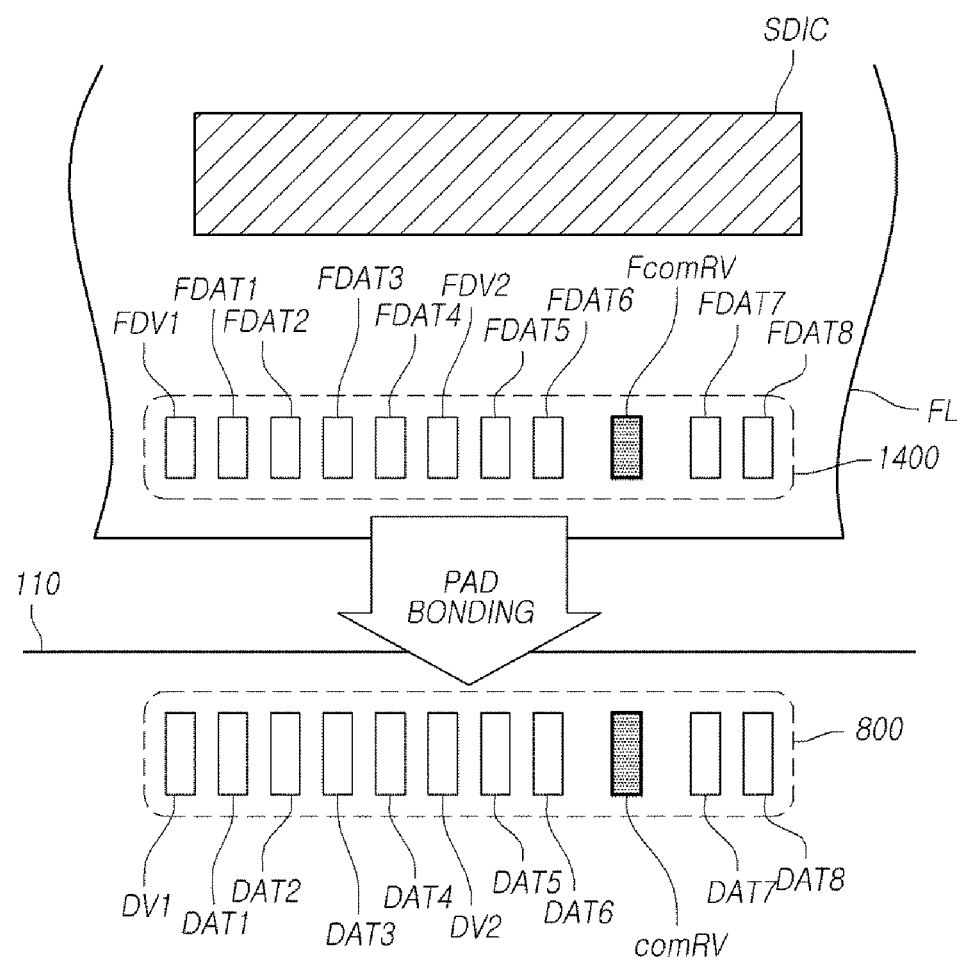
FIG. 14 is a view illustrating a pad region of a film on which a source driver integrated circuit is mounted and the pad region of the organic light-emitting display panel according to the present disclosure.

FIG. 14 is a view illustrating a pad region 800 of the organic light-emitting display panel 110 and a pad region 1400 of a film to which the source driver IN SDIC is mounted.

Referring to FIG. 14, one side of a flexible film FL is bonded to the source PCB SPCB, and the other side thereof is bonded to the pad region 800 of the organic light-emitting display panel 110.

A source driver IC SDIC is mounted to the film FL to drive a data line.

Through the film FL, signals and voltages output from the controller 140 on the control PCB CPCB and a power controller may be supplied to the source driver IC SDIC or the organic light-emitting display panel 110 via the source PCB SPCB.

Thus, the film FL may be provided with the pad region 1400 bonded to the pad region 800 of the organic light-emitting display panel 110 in order for the transfer of signals and voltages.

The pad region 1400 of the film may be provided with film pads FDV1, FDAT1, FDAT2, FDAT3, FDAT4, FDV2, FDAT5, FDAT6, FcomRV, FDAT7, FDAT8, FDV3 to correspond to the order of pads DV1, DAT1, DAT2, DAT3, DAT4, DV2, DAT5, DAT6, comRV, DAT7, DAT8, DV3 disposed on the pad region 800 of the organic light-emitting display panel 110 sequentially.

As described before, with the configuration in which the pad region 800 of the organic light-emitting display panel 110 is designed with the pad structure in which the single common reference voltage pad comRV is provided instead of the two reference voltage pads RV1, RV2, the number of the reference voltage pads provided in the pad region 1400 of the film bonded to the pad region 800 is also reduced.

In the meantime, the source driver IC SDIC may be provided with contact points respectively electrically connected to the film pads FDV1, FDAT1, FDAT2, FDAT3, FDAT4, FDV2, FDAT5, FDAT6, FcomRV, FDAT7, FDAT8, FDV3 provided in the pad region 1400 of the film.

The multiplexer 1000 will now be described in more detail with reference to FIGS. 15 to 17.

Figure 15:
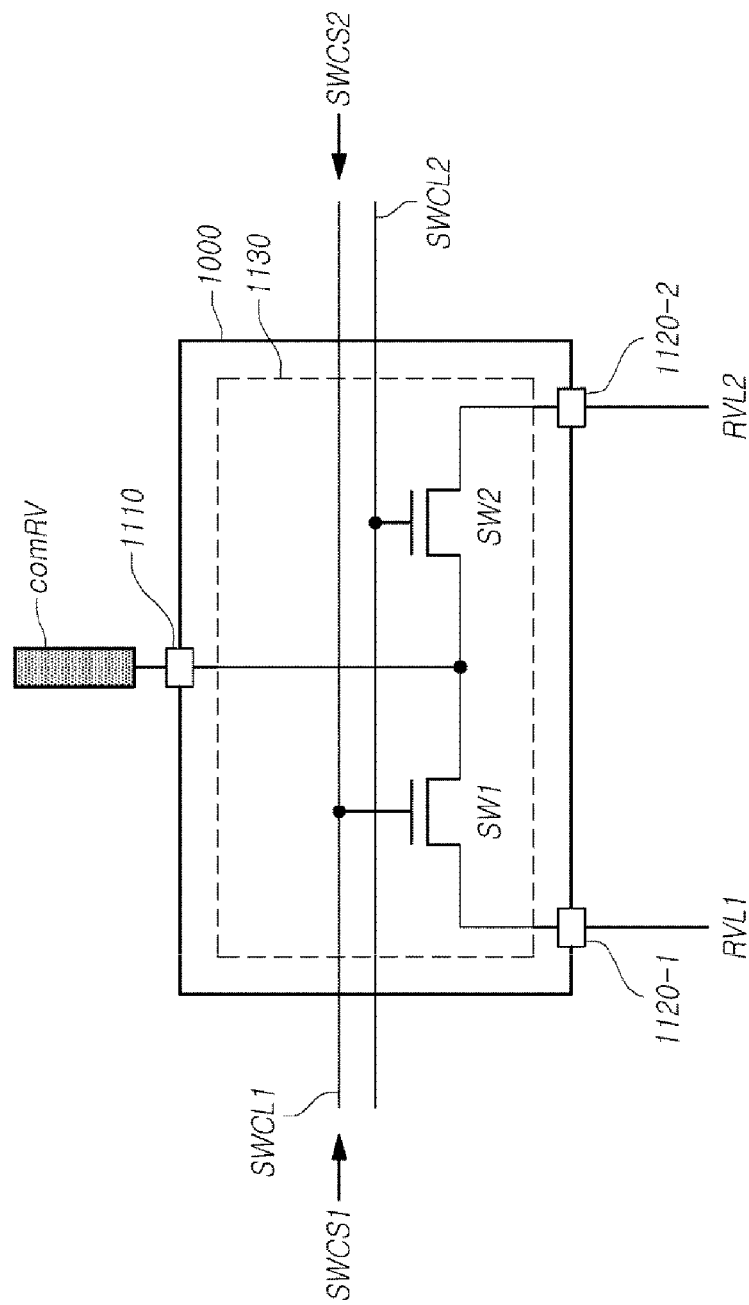
FIG. 15 is a view of a circuit diagram of the multiplexer of the organic light-emitting display panel according to the present disclosure.

FIG. 15 is an example circuit diagram of the multiplexer 1000 of the organic light-emitting display panel 110 according to embodiments.

Referring to FIG. 15, the switching circuit 1130 of the multiplexer 1000 includes two (i.e. n=2) switching devices SW1, SW2 connected to two (i.e. n=2) reference voltage line- connection terminals 1120-1, 1120-2.

One of the switching devices SW1 or SW2 may be connected between the common reference voltage pad-connection terminal 1110 and one of the reference voltage line-connection terminals 1120-1 or 1120-2.

That is, the first switching device SW1 may be connected between the common reference voltage pad-connection terminal 1110 and the first reference voltage line-connection terminal 1120-1. Further, the second switching device SW2 may be connected between the common reference voltage pad-connection terminal 1110 and the second reference voltage line-connection terminal 1120-2.

Referring to FIG. 15, the non-active area N/A may be provided with two (i.e. n=2) switching control lines SWCL1, SWCL2 to supply switching control signals SWCS1, SWCS2 to gate nodes of two (i.e. n=2) switching devices SW1, SW2.

Here, the switching control signals SWCS1, SWCS2 may be supplied from the controller 140.

As described before, with the configuration in which the switching circuit 1130 is designed using the two switching devices SW1, SW2 in a type of transistor turned on and off by gate signals, under the pad structure using the single common reference voltage pad comRV instead of two reference voltage pads RV1, RV2, functions and operations of the multiplexer 1000 required for normal image driving, sensing driving, and sensing operation (sampling) can be effectively provided, and the multiplexer 1000 can be easily embodied into the organic light-emitting display panel 110.

In the meantime, during the image driving, a constant reference voltage Vref should be continuously applied to the organic light-emitting display panel 110.

Thus, one of switching devices SW1 or SW2 between the common reference voltage pad-connection terminal 1110 and one of the reference voltage line-connection terminals 1120-1 or 1120-2 should be maintained in an on state during a period of image driving, besides a period of sensing operation.

Such two (n=2) switching devices SW1, SW2 in the multiplexer 1000 may be readily subjected to positive bias temperature stress (PBTS), leading to changes in the transistor characteristics or an unreliable operation.

Thus, although the number m of the switching devices connected between the common reference voltage pad-connection terminal 1110 and one of the reference voltage line-connection terminals 1120-1 or 1120-2 may be 1 as shown in FIG. 15, the number may be 2 or more in order to reduce the PBTS.

The instance in which the number m of the switching devices connected between the common reference voltage pad-connection terminal 1110 and one of the reference voltage line-connection terminals 1120-1 or 1120-2 is 2 or more will now be described with reference to FIGS. 16 and 17. Particularly, an example instance in which the number m of the switching devices connected between the common reference voltage pad-connection terminal 1110 and one of the reference voltage line-connection terminals 1120-1 or 1120-2 is 2 will be described.

Figure 16:
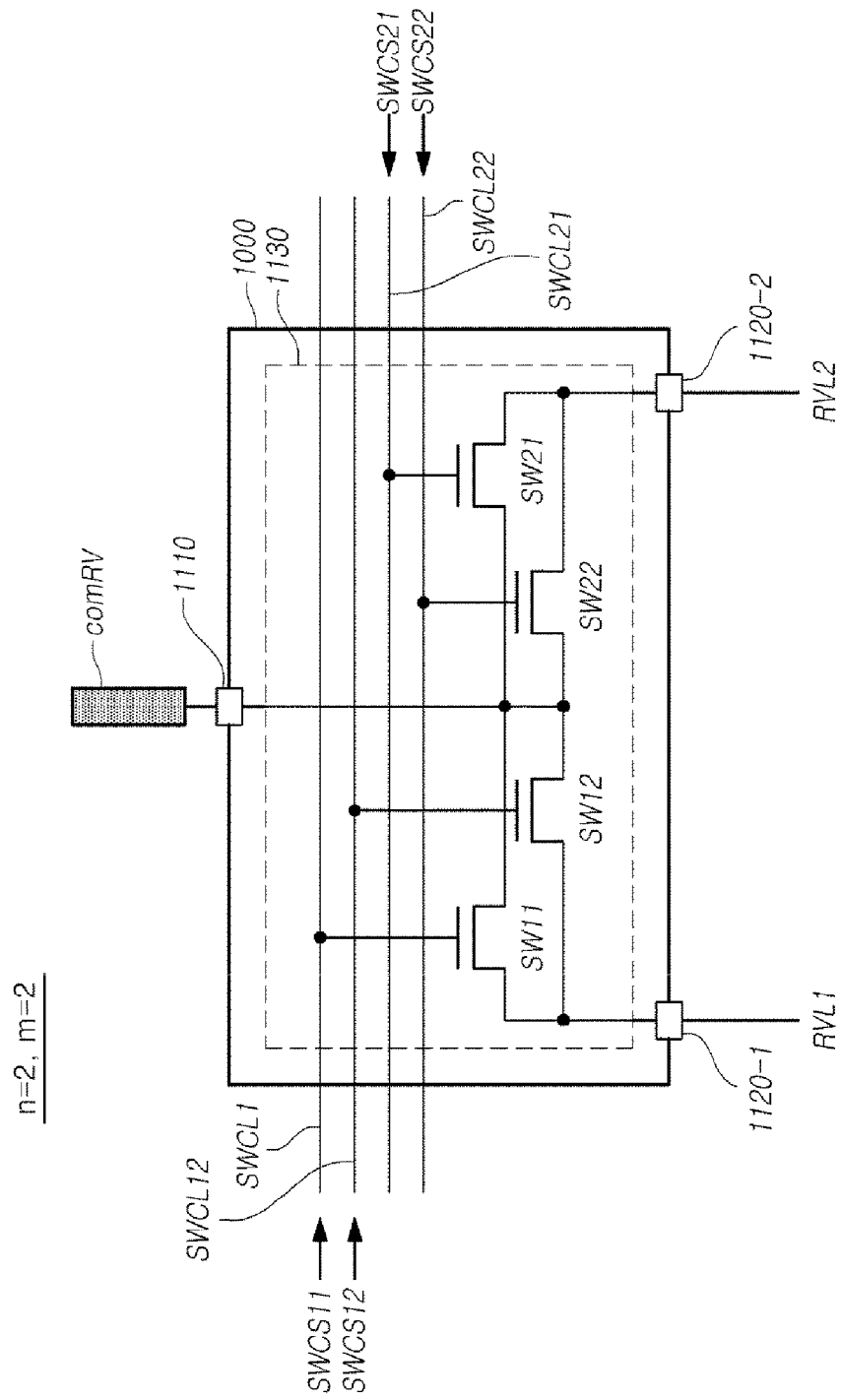
FIG. 16 is another view of the circuit diagram of the multiplexer of the organic light-emitting display panel according to the present disclosure.
Figure 17:
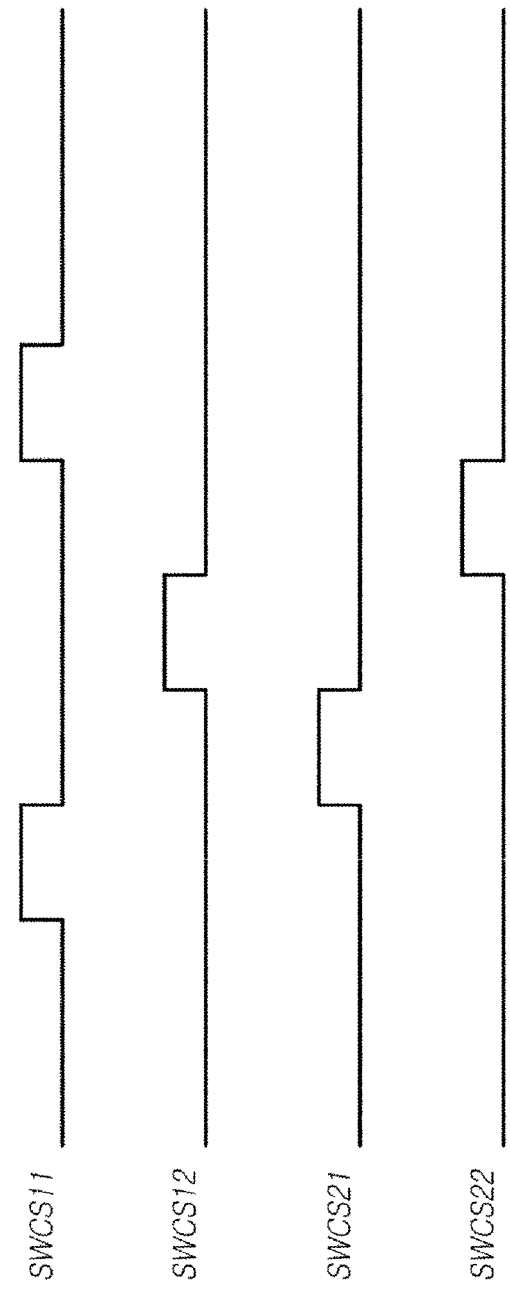
FIG. 17 is a timing chart of four switching element control signals controlling switching operations over four switching elements provided for the multiplexer of the organic light-emitting display panel according to the present disclosure.

FIG. 16 is another example circuit diagram of the multiplexer 1000 of the organic light-emitting display panel 110 according to embodiments, and FIG. 17 is a timing chart of four switching device control signals SWCS11, SWCS12, SWCS21, SWCS22 controlling switching operations over four switching devices SW11, SW12, SW21, SW22 provided for the multiplexer 1000 of the organic light-emitting display panel 110 according to embodiments.

Referring to FIG. 16, the switching circuit 1130 may include 2*2 (i.e. n=2, m=2) switching devices SW11, SW12, SW21, SW22 connected to two (i.e. n=2) reference voltage line-connection terminals 1120-1, 1120-2.

In this instance, two (m=2) switching devices SW11, SW12, or SW21, SW22 are connected between the common reference voltage pad-connection terminal 1110 and one of the reference voltage line-connection terminals 1120-1 or 1120-2 in parallel.

That is, two (m=2) first switching devices SW11, SW12 are connected between the common reference voltage pad-connection terminal 1110 and the first reference voltage line-connection terminal 1120-1 in parallel. In addition, two (m=2) second switching devices SW21, SW22 are connected between the common reference voltage pad-connection terminal 1110 and the second reference voltage line-connection terminal 1120-2 in parallel.

To control switching operations of 2*2 (n=2, m=2) switching devices SW11, SW12, SW21, SW22 connected to two (n=2) reference voltage line-connection terminals 1120-1, 1120-2, the non-active area N/A may be provided with 2*2 (n=2, m=2) switching control lines SWCL11, SWCL12, SWCL21, SWCL22 to supply switching control signals SWCS11, SWCS12, SWCS21, SWCS22 to gate nodes of the 2*2 (n=2, m=2) switching devices SW11, SW12, SW21, SW22.

Referring to FIGS. 16 and 17, two (m=2) switching devices SW11, SW12, or SW21, SW22 connected between the common reference voltage pad-connection terminal 1110 and one of the reference voltage line-connection terminal 1120-1 or 1120-2 in parallel may be alternately turned on.

That is, the first two (m=2) switching devices SWE11, SW12 connected between the common reference voltage pad-connection terminal 1110 and the first reference voltage line-connection terminal 1120-1 in parallel may be alternately turned on according to switching control signals SWCS11, SWCS12 that have opposite on/off timing to each other.

Here, the switching control signals SWCS11, SWCS12 applied to the gate nodes of the first switching devices SW11, SW12 have a duty cycle of 50%, for example.

The two (m=2) switching devices SWE21, SW22 connected between the common reference voltage pad-connection terminal 1110 and the second reference voltage line-connection terminal 1120-2 in parallel may be alternately turned on according to switching control signals SWCS21, SWCS22 that have opposite on/off timing to each other.

Here, the switching control signals SWCS21, SWCS22 applied to the gate nodes of the second switching devices SW21, SW22 have a duty cycle of 50%, for example.

With the configuration of switching connections between the common reference voltage pad-connection terminal 1110 and the n reference voltage line-connection terminals 1120-1, 1120-2 while alternately turning on the two or more switching devices SW11, SW12; SW21, SW22 connected between the common reference voltage pad-connection terminal 1110 and each of the n reference voltage line-connection terminal 1120-1, 1120-2 in parallel as shown in FIGS. 16 and 17, the PBTS of the n*m switching devices SW11, SW12, SW21, SW22 in the switching circuit 1130 can be reduced, thereby leading to improved operation reliability of the multiplexer 1000.

The above-mentioned configurations concerned on the pad structure and the multiplexer 1000 in the organic light-emitting display panel 110 will be described again briefly.

Figure 18:
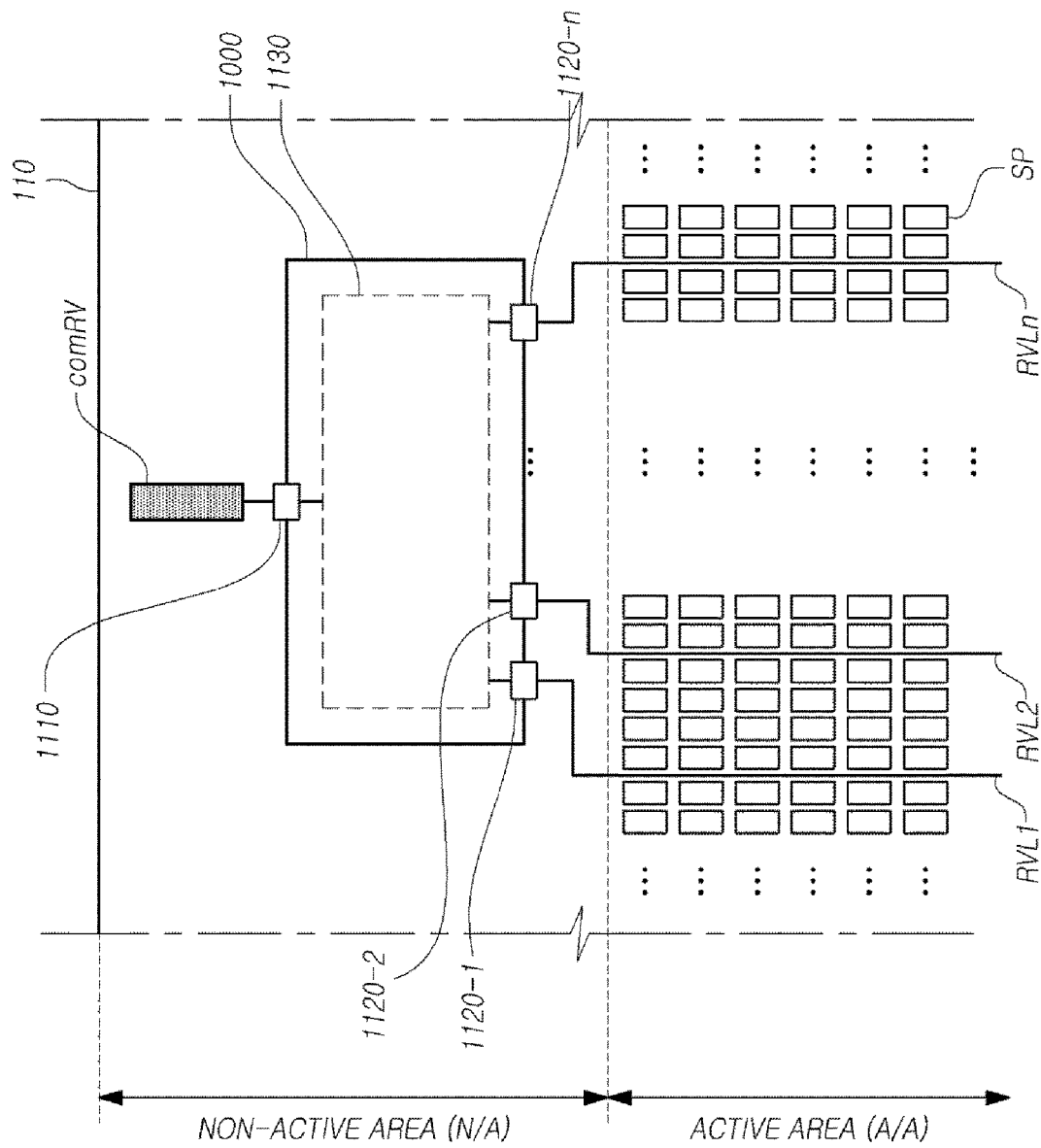
FIG. 18 is a view simply illustrating the organic light-emitting display panel according to the present disclosure.

FIG. 18 is a schematic view illustrating the organic light-emitting display panel 110 according to embodiments.

Referring to FIG. 18, the organic light-emitting display panel 110 may include n reference voltage lines RVL1, RVL2, ..., RVLn arranged on an active area A/A, where n is a natural number of 2 or more, a single common reference voltage pad comRV arranged on a non-active area N/A, and a multiplexer 1000 disposed on the non-active area N/A to switch connections between the single common reference voltage pad comRV and the n reference voltage lines RVL1, RVL2, ..., RVLn.

Referring to FIG. 18, the multiplexer 1000 includes a single common reference voltage pad-connection terminal 1110 electrically connected to the single common reference voltage pad comRV, n reference voltage line-connection terminals 1120-1, 1120-2, ..., 1120-n respectively electrically connected to n reference voltage lines RVL1, RVL2, ..., RVLn, and a switching circuit 1130 configured to switch connections between the single common reference voltage pad-connection terminal 1110 and the n reference voltage line-connection terminals 1120-1, 1120-2.

With the configurations of the organic light-emitting display panel 110 having the pad structure in which the single common reference voltage pad comRV is provided instead of the two reference voltage pads RV1, RV2, and the multiplexer 1000 allowing connections between the single common reference voltage pad comRV and the n reference voltage lines RVL1, RVL2, ..., RVLn, the number of the reference voltage pads provided in the pad region 800 is reduced, thereby reducing a possibility of a short circuit caused by foreign objects between the common reference voltage pad comRV and an adjacent pad.

Accordingly, accurate image driving may be obtained using the n reference voltage lines RVL1, RVL2, ..., RVLn, and an accurate sensing operation may also be obtained through the two reference voltage lines RVL1, RVL2.

Although the pad structure and the multiplexer 1000 have been described with respect to the protection of the reference voltage pads, they may also be used for the protection of other voltage-concerned pads.

Figure 19:
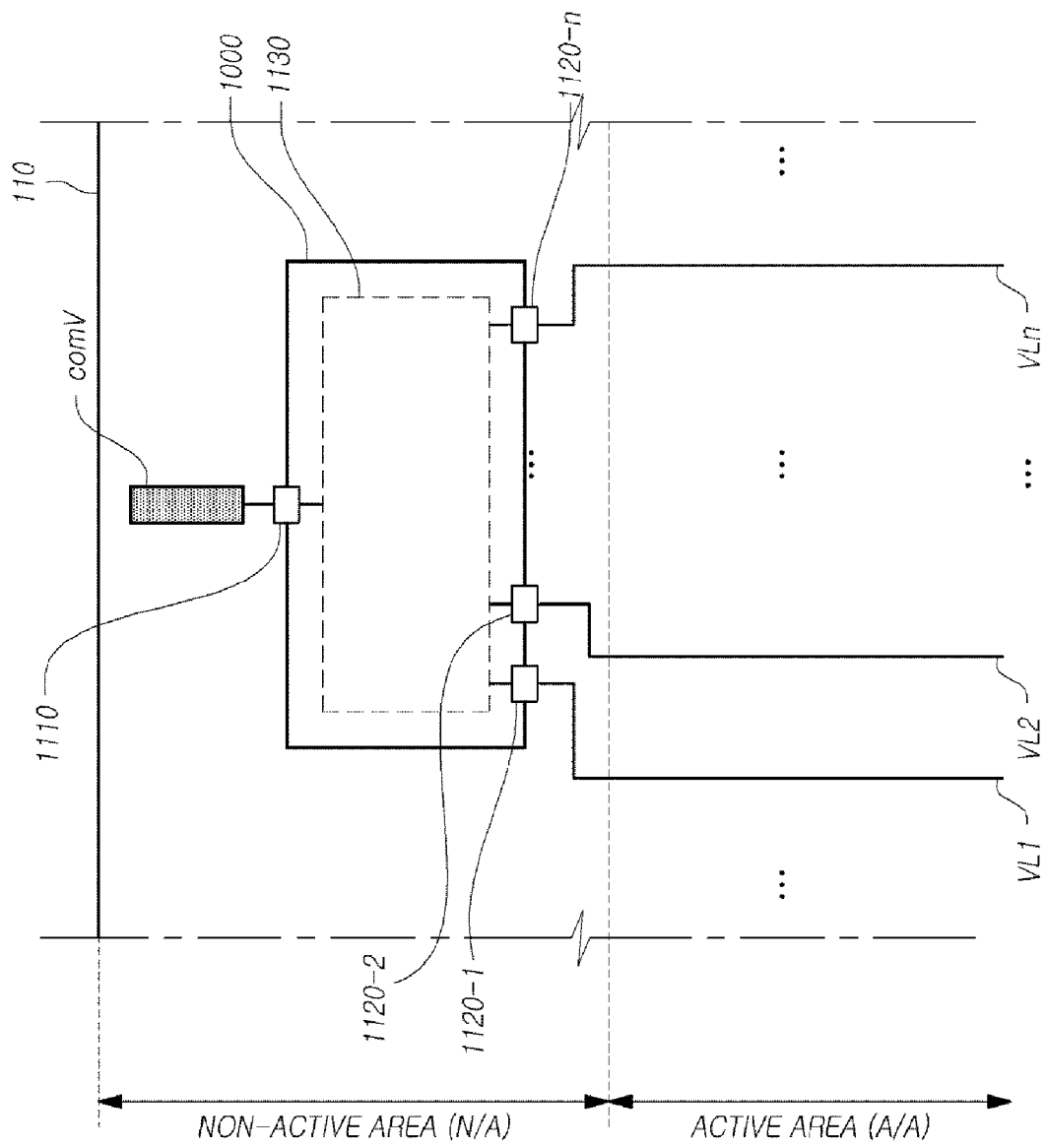
FIG. 19 is another view simply illustrating the organic light-emitting display panel according to the present disclosure.

FIG. 19 is a schematic view of the organic light-emitting display panel 110 according to embodiments. The organic light-emitting display panel 110 of FIG. 19 may also be applied to other kinds of display panels, such as an LCD panel and the like.

Referring to FIG. 19, the organic light-emitting display panel 110 may include n voltage lines VL1, VL2, . . . , VLn arranged on an active area A/A, where n is a natural number of 2 or more, a single common voltage pad comV arranged on a non-active area N/A, and a multiplexer 1000 disposed on the non-active area N/A to switch connections between the single common voltage pad comV and the n voltage lines VL1, VL2, . . . , VLn.

Here, the n voltage lines VL1, VL2, . . . , VLn may be reference voltage lines RVL, driving voltage lines DVL, or the like, for example.

Referring to FIG. 19, the multiplexer 1000 includes a single common voltage pad-connection terminal 1110 electrically connected to the single common voltage pad comV, n voltage line-connection terminals 1120-1, 1120-2, . . . , 1120-n respectively electrically connected to the n voltage lines VL1, VL2, . . . , VLn, and a switching circuit 1130 configured to switch connections between the single common voltage pad-connection terminal 1110 and the n voltage line-connection terminals 1120-1, 1120-2.

With the configurations of the organic light-emitting display panel 110 having the pad structure in which the single common voltage pad comV is provided instead of the two voltage pads, and the multiplexer 1000 allowing connections between the single common voltage pad comV and the n voltage lines Vl1, V12, . . . , VLn, the number of the reference voltage pads provided in the pad region 800 is reduced, thereby reducing a possibility of a short circuit caused by foreign objects between the common voltage pad comV and an adjacent pad.

Figure 20:
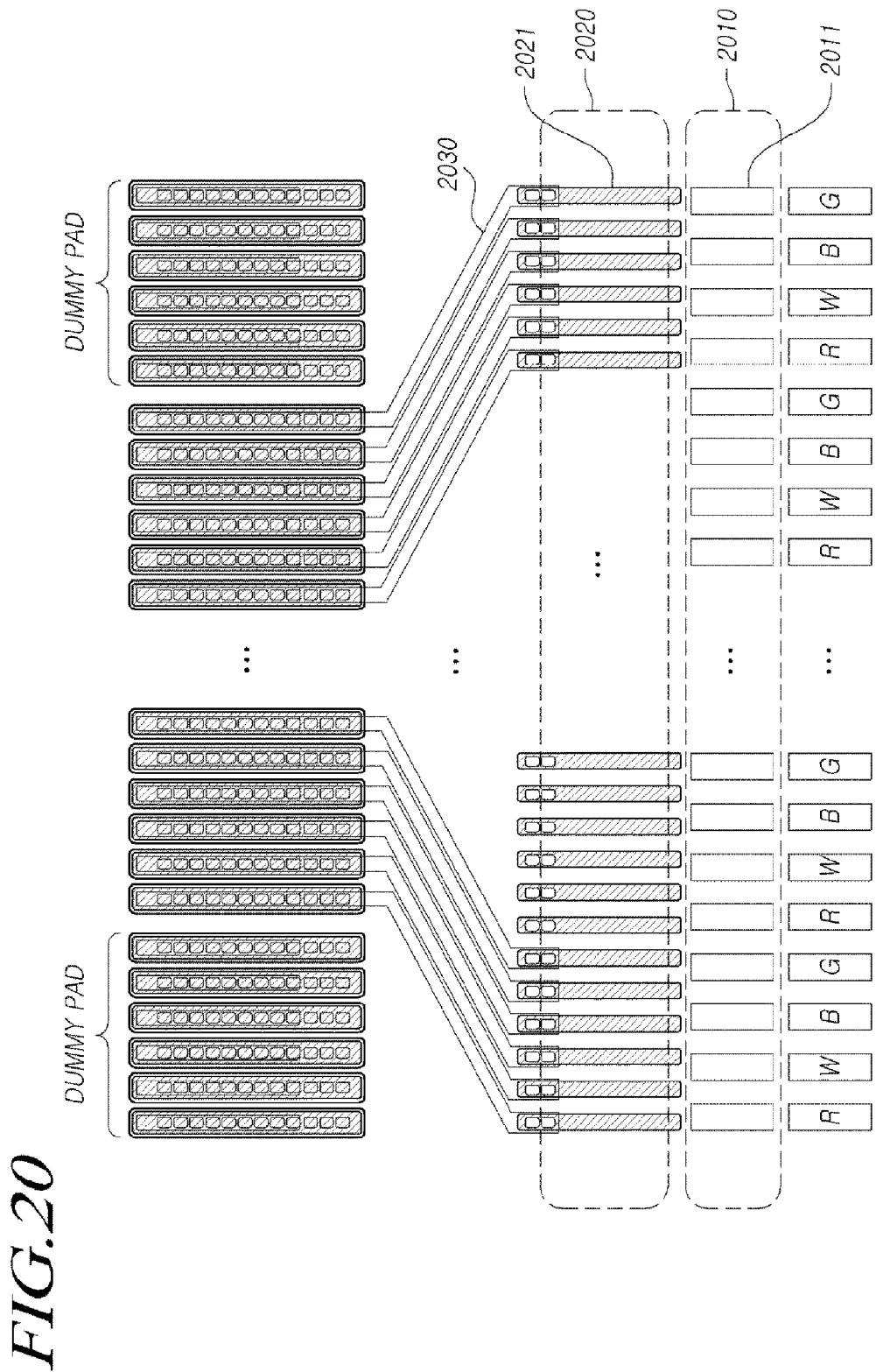
FIG. 20 is a view illustrating a position of the multiplexer of the organic light-emitting display panel according to the present disclosure.

FIG. 20 is a view illustrating the position of the multiplexer 1000 in the organic light-emitting display panel 110 according to embodiments.

Referring to FIG. 20, the organic light-emitting display panel 110 is provided with a dummy subpixel region 2010, in which a plurality of dummy subpixels 2011 are provided.

Signal lines in the active area A/A may be connected to pad line connections 2021 of a pad line connection region 2020 and further to pads in the pad region 800 via links 2030. The pad region 800 may be provided with a dummy pad.

Referring to FIG. 20, the multiplexer 1000 may be positioned at an outermost dummy subpixel region 2010 of the organic light-emitting display panel 110.

As set forth above, if positioned at the outermost dummy subpixel region 2010 of the organic light-emitting display panel 110, the multiplexer 1000 may be disposed on the organic light-emitting display panel 110 without a need for a separate space for the multiplexer 1000.

Referring to FIG. 20, the multiplexer 1000 may also be positioned at the pad line connection region 2020 of the organic light-emitting display panel 110.

As described above, if positioned at the pad line connection region 2020 of the organic light-emitting display panel 110, the multiplexer 1000 may be disposed on the organic light-emitting display panel 110 without a need for a separate space for the multiplexer 1000.

According to the present disclosure as set forth above, it is possible to provide the organic light-emitting display panel and the organic light-emitting display device having a pad structure in which there is a low possibility of a short circuit occurring between pads.

Further, according to the present disclosure, it is possible to provide the organic light-emitting display panel and the organic light-emitting display device having a switching structure in which a common voltage pad able to be connected to a plurality of voltage lines is provided without providing individual pads for each of the respective voltage lines, thereby reducing the number of pads to reduce a possibility of a short circuit occurring between the pads, and enabling accurate voltage transfer to the plurality of voltage lines.

Further, according to the present disclosure, it is possible to provide the organic light-emitting display panel and the organic light-emitting display device providing a common reference voltage pad able to be connected to a plurality of reference voltage lines without providing individual pads for each of the respective reference voltage lines, and thereby can reduce the number of reference voltage pads to reduce a possibility of a short circuit occurring between the reference voltage pad and an adjacent pad.

Further, according to the present disclosure, it is possible to provide the organic light-emitting display panel and the organic light-emitting display device having a switching structure in which a common reference voltage pad able to be connected to a plurality of reference voltage lines is provided without providing individual pads for each of the respective reference voltage lines, thereby reducing the number of reference voltage pads to reduce a possibility of a short circuit occurring between the reference voltage pad and an adjacent pad, and enabling accurate reference voltage transfer to the plurality of reference voltage lines.

In addition, according to the present disclosure, it is possible to provide the organic light-emitting display panel and the organic light-emitting display device having a switching structure in which a common reference voltage pad able to be connected to a plurality of reference voltage lines is provided without providing individual pads for each of the respective reference voltage lines, thereby reducing the number of reference voltage pads to reduce a possibility of a short circuit occurring between the reference voltage pad and an adjacent pad, enabling accurate transfer of a reference voltage to the plurality of reference voltage lines under a structure of the common reference voltage pad, and allowing accurate sensing values of subpixels to be obtained through the reference voltage lines.

The foregoing descriptions and the accompanying drawings have been presented in order to explain certain principles of the present disclosure. A person skilled in the art to which the disclosure relates could make many modifications and variations by combining, dividing, substituting for, or changing the elements without departing from the principle of the disclosure. The foregoing embodiments disclosed herein shall be interpreted as illustrative only but not as limitative of the principle and scope of the disclosure. It should be understood that the scope of the disclosure shall be defined by the appended claims and all of their equivalents fall within the scope of the disclosure.

What is claimed is:

1. An organic light-emitting display panel comprising:
    an active area corresponding to an image display region; and a non-active area corresponding to a region outside of the active area,
wherein the active area includes a plurality of signal lines arranged in an array,
wherein the non-active area includes a pad region to which a source driver IC is mounted, and a switching structure,
wherein the pad region includes a plurality of pads arranged in correspondence with the array of the signal lines, and
wherein the switching structure includes:
a common reference voltage pad-connection terminal connected to a common reference voltage pad of the display panel;
a plurality of reference voltage line-connection terminals connected to a plurality of reference voltage lines of the display panel; and
a switching circuit to switch connections between the common reference voltage pad-connection terminal and the plurality of reference voltage line-connection terminals.

2. The organic light-emitting display panel of claim 1, wherein the common reference voltage pad is disposed commonly among data pads of a plurality of pixels of the display panel.

3. The organic light-emitting display panel of claim 1, wherein the switching circuit serves to divide and output a reference voltage input to a common voltage input point to two or more voltage output points, and selectively outputs the reference voltage to one of the two or more voltage output points.

4. The organic light-emitting display panel of claim 2, further comprising:
at least two pixels of the plurality of pixels,
a plurality of data line per each pixel,
a driving voltage line per the each pixel, and
reference voltage line per the each pixel.

5. The organic light-emitting display panel of claim 1, wherein the switching structure includes at least one multiplexer.

6. The organic light-emitting display panel of claim 1, wherein the at least one multiplexer performs a switching operation using the switching circuit according to a driving mode of the organic light-emitting display panel.

7. The organic light-emitting display panel of claim 6, wherein, when the driving mode is an image driving mode, the switching circuit connects all of the plurality of reference voltage line-connection terminals to the common reference voltage pad-connection terminal for a period of image driving.

8. The organic light-emitting display panel of claim 6, wherein, when the driving mode is a sensing operation mode, the switching circuit connects the common reference voltage pad-connection terminal to a specified reference voltage line-connection terminal electrically connected to a subpixel to be sensed, from among the plurality of reference voltage line-connection terminals for a period of sensing operation.

9. The organic light-emitting display panel of claim 6, wherein the plurality of pads includes a common reference voltage pad and other pads, and
wherein a distance between the common reference voltage pad and an adjacent one of the other pads is greater than a distance between non-adjacent other pads.

10. The organic light-emitting display panel of claim 1, wherein the switching circuit includes n*m switching devices connected to n number of the plurality of reference voltage line-connection terminals, where n and m are each a natural number of 2 or more, wherein m switching devices are connected between the common reference voltage pad-connection terminal and each of the reference voltage line-connection terminals in parallel.

11. The organic light-emitting display panel of claim 10, wherein the non-active area has n*m switching control lines arranged to supply switching control signals to gate nodes of the n*m switching devices.

12. The organic light-emitting display panel of claim 5, wherein the at least one multiplexer is positioned in an outermost dummy subpixel region of the display panel.

13. The organic light-emitting display panel of claim 5, wherein the at least one multiplexer includes a plurality of switching devices that is subjected to positive bias temperature stress (PBTS).

14. The organic light-emitting display panel of claim 13, wherein the number of the plurality of switching devices connected between the common reference voltage pad-connection terminal and one of the reference voltage line-connection terminals are two or more to reduce the PBTS.

15. The organic light-emitting display panel of claim 10, wherein switching connections between the common reference voltage pad-connection terminal and n number of the plurality of reference voltage line-connection terminals while alternately turning on the plurality of switching devices connected between the common reference voltage pad-connection terminal and each of the n reference voltage line-connection terminal in parallel reduce the PBTS of the n*m switching devices.

16. An organic light-emitting display device, comprising:
the organic light-emitting display panel of claim 1,
wherein the organic-light emitting display panel further includes:
a plurality of subpixels, each of the plurality of subpixels having an organic light-emitting diode and a driving transistor driving the OLED are disposed in a matrix pattern, wherein one data line is provided for each row of the subpixels,
one or two gate lines provided for each column of subpixels,
one driving voltage line provided for one or more rows of the subpixels, and
one reference voltage line provided for each of the one or more rows of the subpixels.

17. The organic light-emitting display device according to claim 16, wherein, in eight rows of subpixels,
the active area includes a first driving voltage line, first and second data lines, a first reference voltage line, a third data line, a fourth data line, a second driving voltage line, fifth and sixth data lines, a second reference voltage line, and seventh and eighth data lines disposed sequentially, and
the pad region of the non-active area includes a first driving voltage pad, first to fourth data pads, a second driving voltage pad, fifth and sixth data pads, the common reference voltage pad, and seventh and eighth data pads disposed sequentially.

18. The organic light-emitting display device according to claim 17, wherein the first and second driving voltage lines are respectively connected to the first and second driving voltage pads,
wherein the first to eighth data lines are respectively connected to the first to eighth data pads, and
wherein the first and second reference voltage lines are commonly connected to the single common reference voltage pad through the switching structure.

19. The organic light-emitting display device according to claim 17, further comprising:
   a source drive integrated circuit driving the data line; and
   a film on which the source driver integrated circuit is mounted,
   wherein the film is provided with a film pad region bonded to the pad region of the organic light-emitting display panel, and
   wherein the film pad region has film pads positioned to correspond to the order of pads provided on the pad region of the organic light-emitting display panel.

20. The organic light-emitting display device according to claim 16, wherein the non-active area has n switching control lines arranged to supply switching control signals to gate nodes of the n switching devices.

* * * * *